US008778462B2

(12) United States Patent
Brabbs et al.

(10) Patent No.: US 8,778,462 B2
(45) Date of Patent: Jul. 15, 2014

(54) METHOD FOR PRODUCING METALIZED FIBROUS COMPOSITE SHEET WITH OLEFIN COATING

(75) Inventors: Noel Stephen Brabbs, Garnich (LU); Eric Huebsch, Contern (LU); Yufei Tao, Hockessin, DE (US); Lech Wilczek, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 230 days.

(21) Appl. No.: 13/293,203

(22) Filed: Nov. 10, 2011

(65) Prior Publication Data
US 2013/0122316 A1 May 16, 2013

(51) Int. Cl.
*C08F 2/46* (2006.01)
*B32B 15/085* (2006.01)
*C23C 16/00* (2006.01)
*C23C 16/06* (2006.01)
*B05D 3/10* (2006.01)
*B05D 3/04* (2006.01)
*B05D 3/06* (2006.01)

(52) U.S. Cl.
CPC .............. *B05D 3/04* (2013.01); *B32B 15/085* (2013.01); *C23C 16/00* (2013.01); *C23C 16/06* (2013.01); *B05D 3/10* (2013.01); *B05D 3/06* (2013.01)
USPC ........... 427/487; 427/488; 427/496; 427/508; 427/255.14; 427/250

(58) Field of Classification Search
CPC .......... B05D 3/068; B05D 7/14; B32B 15/04; B32B 15/082; C23C 14/24
See application file for complete search history.

(56) References Cited

U.S. PATENT DOCUMENTS

| | | | |
|---|---|---|---|
| 3,081,519 A | 3/1963 | Blades et al. |
| 3,169,899 A | 2/1965 | Steuber |
| 3,227,784 A | 1/1966 | Blades et al. |
| 3,851,023 A | 11/1974 | Brethauer et al. |
| 4,739,012 A | 4/1988 | Hagman |

(Continued)

FOREIGN PATENT DOCUMENTS

| | | |
|---|---|---|
| EP | 1 400 348 A2 | 3/2004 |
| WO | 98/18852 | 5/1998 |

(Continued)

OTHER PUBLICATIONS

Studer, Redox and Photoinitiated Crosslinking Polymerization I. Dual Cure Isocyanate Acrylate System, Progress in Organic Coatings, vol. 53, 2005, pp. 126-133.

(Continued)

*Primary Examiner* — Elena T Lightfoot

(57) ABSTRACT

A composite sheet comprises a substrate and a multi-layer coating on its outer surface, the coating comprising a metal layer and an outer polymeric layer formed from a precursor comprising a polymerizable composition that includes an olefin group and a moisture curable group, such as an isocyanate or silane group. The function of the polymeric layer includes protecting the metal layer from corrosion. A production process for the composite sheet includes depositing the precursor and exposing it to both beam radiation and moisture, which respectively promote polymerization and curing at different sites of the precursor. The amenability of the isocyanate or silane functionality to moisture-promoted coupling promotes substantially full conversion and curing of the precursor, even of portions of the substrate that are geometrically shadowed from incident beam radiation.

24 Claims, 11 Drawing Sheets

(56) References Cited

U.S. PATENT DOCUMENTS

| | | | |
|---|---|---|---|
| 4,868,062 A | | 9/1989 | Hoeschele et al. |
| 5,221,560 A | * | 6/1993 | Perkins et al. ............... 427/515 |
| 5,371,116 A | * | 12/1994 | Sakamoto et al. ............. 522/33 |
| 5,955,175 A | | 9/1999 | Culler |
| 6,083,628 A | | 7/2000 | Yializis |
| 6,562,222 B1 | * | 5/2003 | Sekiguchi et al. ........... 205/296 |
| 6,706,412 B2 | * | 3/2004 | Yializis ........................ 428/463 |
| 2004/0241454 A1 | | 12/2004 | Shaw et al. |
| 2005/0178330 A1 | | 8/2005 | Goodwin et al. |
| 2006/0040091 A1 | | 2/2006 | Bletsos et al. |
| 2006/0078700 A1 | | 4/2006 | Bletsos et al. |
| 2008/0187740 A1 | | 8/2008 | Bletsos et al. |
| 2010/0143676 A1 | * | 6/2010 | Hahn et al. ................... 428/212 |
| 2011/0098402 A1 | * | 4/2011 | Yamane et al. ............... 524/521 |

FOREIGN PATENT DOCUMENTS

| | | |
|---|---|---|
| WO | 01/59809 A1 | 8/2001 |
| WO | 02/028548 A3 | 11/2002 |
| WO | 2005/110626 A3 | 11/2005 |

OTHER PUBLICATIONS

Studer, Redox and Photoinitiated Crosslinking Polymerization II. Neat Acrylate Resin, Progress in Organic Coatings, vol. 53, 2005, pp. 134-146.

Studer, Redox and Photoinitiated Crosslinking Polymerization III. Clear and Pigmented Acrylic Coatings, Progress in Organic Coatings, vol. 54, 2005, pp. 230-239.

ISO 811-1981, Textile Fabrics—Determination of Resistance to Water Penetration—Hydrostatic Pressure Test, Oct. 1, 1981.

ASTM Standard C1371-04A, Test Method for Determination of Emittance of Materials Near Room Temperature Using Portable Emissometers, 2010.

ASTM Standard D737-04, Test Method for Air Permeability of Textile Fabrics, 2008.

ASTM Standard F1249-06, Test ,ETJPD FPR Water VA[PR TRAMS,OSSOPM Rate Through Plastic Film and Sheeting Using a Modulated Infrared Sensor, 2011.

* cited by examiner

METHOD FOR PRODUCING METALIZED FIBROUS COMPOSITE SHEET WITH OLEFIN COATING

FIELD OF THE INVENTION

This invention relates to a method for effecting polymerization of an olefin and, more particularly, to a method for producing a metalized, fibrous composite sheet with an olefin coating that employs a combination of radiation from an e-beam or UV source with exposure to moisture to effect olefin polymerization and cross-linking of the polyolefin coating.

BACKGROUND OF THE INVENTION

The polymerization of many common monomers and polymer cross-linking can be induced by exposure to radiation in the form of either photons or electrically charged particles. Energy deposited in the monomer by either radiation is believed to cause formation of free radicals, which in turn can induce polymerization and cross-linking. The term "beam radiation" is used herein to refer collectively to any form of charged particle-beam or photon irradiation that is capable of initiating or otherwise promoting polymerization of a monomer or cross-linking of any other polymer precursor.

Beam radiation is widely used in industrial practice to promote polymerization of monomers or curing of other polymeric coating precursors. Beam radiation typically is derived from a radiation source, and readily lends itself to in-line, continuous processes, such as those appointed for producing indefinite lengths of thin sheet material that include a polymeric coating. For example, the production of such material may include steps of applying the coating precursor to an advancing web and then exposing the coated web to a suitable radiation source. Ideally, the energy of the particles or photons must be sufficient both to penetrate the desired coating thickness and deposit enough energy to generate free radicals. Typically, energetic electrons (often termed "e-beam radiation") or photons in the ultraviolet (UV) range are employed. A relatively short-duration exposure to radiation of suitable intensity generally suffices, without unduly increasing the substrate temperature. Sources capable of producing any of the foregoing forms of radiation are known in the art.

However, beam radiation by its very nature is effective only for initiating curing of precursor material that lies in a line of sight. That is to say, beams of either charged particles or photons typically emanate from the radiation source and propagate therefrom along a straight-line path. Curing can be induced only for material positioned so as to intercept the direct beam. Although e-beams can in principle be deflected by electrostatic or magnetic forces, in practice the extent of deflection attainable with practical electromagnetic structures is relatively limited. UV light can be directed to some extent by optical structures such as lenses, mirrors, and gratings analogous to those used with visible light. However, UV optics typically are more difficult to construct and maintain than their visible-spectrum counterparts.

Thus, the use of these forms of beam radiation to polymerize and cure polymer precursors that coat simple, planar substrate structures is straightforward. However, beam-induced curing of precursors coating structures that depart from strict planarity is less satisfactory because of the problem of shadowing. More specifically, areas of the substrate that do not lie in the line of sight of the beam source inherently do not receive any radiation, and so may be said to be shadowed. Even if the beam has relatively high divergence and may emanate from a source that is other than a point source (such as a line or other extended source) or that is otherwise diffused, the fundamental limitation of line of sight remains. Thus, the polymerization and cross-linking reactions in shadowed areas cannot be initiated by the beam radiation.

Failure to cure even a small fraction of the precursor in a coating can, in some cases, be highly objectionable. Many uncured monomers commonly used in coatings, notably acrylates, are known to be toxic, to emit objectionable odors, and to impart undesirable tackiness and dust pickup to a surface, even in relatively small amounts. The presence of tacky monomer on a sheet surface makes it difficult to unroll material from a supply roll. Thus, techniques that result in substantially complete curing of a coating to mitigate these detrimental consequences remain highly sought.

The problem of shadowing arises in principle for beam-based curing of the coating of any non-planar article. An approach to the problem of shadowing in curing acrylate coatings has been proposed by Studer et al., Progress in Organic Coatings (2005), 53(2), 126-133; Progress in Organic Coatings (2005), 53(2), 134-146; and Progress in Organic Coatings (2005), 54(3), 230-239. These disclosures suggest the combination of photoinitiated polymerization and crosslinking with a thermally-initiated radical polymerization, which is made possible by the inclusion of both a photoinitiator, such as an acylphosphine oxide, and a suitable redox thermal initiator, such as cerium(IV) ammonium nitrate $[Ce(NH_4)_2(NO_3)_6]$, in the coating precursor material. Such a dual-cure process is said to be viable for automobile pigmented paint and clearcoat applications. For coatings on items such as an automobile body or portion thereof, the shape inherently causes UV illumination to be at least non-uniform, if not completely shadowed, in portions of the object. However, the dual-cure processes suggested by the Studer references require that the substrate be heated. In some of the examples given, a temperature of about 140° C. is specified. Many polymer substrates cannot withstand such a temperature. Although some curing would occur at lower temperatures, the kinetics of the cross-linking reaction would then dictate impractically long hold times. Thus, a process involving thermal curing is not even a feasible option for many substrate materials.

The shadowing problem is especially vexing in connection with the coating of generally planar but fibrous materials, in which substantial portions of the effective surface are shadowed by the inherent topology of the surface. Application of the coating precursor material, especially if done by vapor-phase methods, inevitably causes some of the precursor material to be deposited in interstices created by the network of fibers defining the surface layer. These interstices are below the bulk surface of the substrate, but are still in its immediate vicinity. They are readily able to communicate with the surrounding atmosphere. Directing beam radiation to impinge on the fibrous sheet material at varying angles of incidence only partially mitigates shadowing, because the inherent topology of the surface texture dictates that the underside of some fibers has no outward-facing exposure.

Planar, fibrous sheet materials used in the building construction industry as moisture vapor-permeable sheets for wall and roof wrapping provide an example in which the problem of shadowing can arise, as some forms of these materials include a surface polymeric coating that must be cured by cross-linking.

US Published Patent Application No. US2008/0187740 to Bletsos et al. ("the '740 publication"), which is commonly owned with the present application, discloses a metalized, moisture vapor permeable composite sheet formed by coating at least one side of a moisture vapor permeable substrate with at least one metal layer and at least one thin polymeric coating layer on the side of the metal layer opposite the substrate. The coating may be formed under vacuum using vapor deposition techniques under conditions that substantially coat the substrate without significantly reducing its moisture vapor permeability. The composite sheet is said to have high moisture vapor permeability, and good thermal barrier properties. The composite sheet can also be selected to provide a high barrier to intrusion by liquid water (signaled by a high hydrostatic head), which is another important characteristic for construction end uses such as house wrap and roof lining. Such a composite sheet is said to provide a thin, strong, breathable air and thermal barrier that is suitable for use in existing or new construction.

Notwithstanding these advances, there remains a need for improved products in which coated fibrous materials can be produced efficiently yet retain their desirable physical and structural properties throughout their entire lifecycle.

SUMMARY OF THE INVENTION

In an aspect, the present invention provides a composite sheet comprising:
a substrate having a first outer surface and an opposing second outer surface; and
a multi-layer coating on the first outer surface of the substrate, the multi-layer coating comprising:
a metal layer overlaying the first outer surface of the substrate; and an outer polymeric layer overlaying the metal layer, and comprising a three-dimensional network containing a plurality of linkages having a structure -A-R—B—, wherein A is an olefin group polymerically linked to another olefin group, B is a silane or isocyanate group cross-linked to another silane or isocyanate group, and R is a diradical comprising at least one of a C1 to C20 alkylene or aryl, each optionally substituted with a member selected from the group consisting of O, N, P and S, and wherein the alkylene can be linear, branched, or cyclic.

Another aspect provides a composite sheet comprising:
a substrate having a first outer surface and an opposing second outer surface; and
a multi-layer coating on the first outer surface of the substrate, the multi-layer coating comprising:
a metal layer overlaying the first outer surface of the substrate; and
an outer polymeric coating layer overlaying the metal layer and formed by curing a precursor that comprises a dual-function composition that includes an olefin group and a moisture-curable group.

Still further, there is provided a process for manufacturing a composite sheet comprising:
providing a substrate having a first outer surface and an opposing second outer surface;
metalizing the first outer surface of the substrate to form thereon a metal layer;
depositing on the metal layer a precursor of an outer polymeric coating layer to form a precursor film, the precursor comprising a dual-function composition including an olefin group and a moisture curable group; and
treating the precursor to form the outer polymeric coating layer, the treating comprising:
creating free radicals in the precursor to induce polymerization of at least a portion thereof; and
exposing the precursor film to water vapor.

Typically, the olefin group used in the precursor is radically polymerizable and the moisture curable group is a silane or isocyanate group. In various embodiments, the creation of free radicals is accomplished by at least one of exposure to beam radiation or a plasma discharge.

Yet another aspect provides a process for manufacturing a composite sheet that comprises:
providing a substrate having a first outer surface and an opposing second outer surface;
metalizing the first outer surface of the substrate to form thereon a metal layer;
depositing on the metal layer a precursor of an outer polymeric coating layer to form a precursor film, the precursor being capable of being cured to form a three-dimensional network containing a plurality of linkages having a structure -A-R—B—, wherein A is an olefin group polymerically linked to another olefin group, B is a silane or isocyanate group cross-linked to another silane or isocyanate group, and R is a diradical comprising at least one of a C1 to C20 alkylene or aryl, each optionally substituted with a member selected from the group consisting of O, N, P and S, and wherein the alkylene can be linear, branched, or cyclic; and
treating the precursor to form the outer polymeric coating layer, the treating comprising:
creating free radicals in the precursor to induce polymerization of at least a portion thereof; and
exposing the precursor film to water vapor.

Still other aspects provide a wall system or a roof system comprising the foregoing composite sheet.

BRIEF DESCRIPTION OF THE DRAWINGS

The invention will be more fully understood, and further advantages will become apparent, when reference is made to the following detailed description of the preferred embodiments of the invention and the accompanying drawings in which.

DETAILED DESCRIPTION

Figure 1:
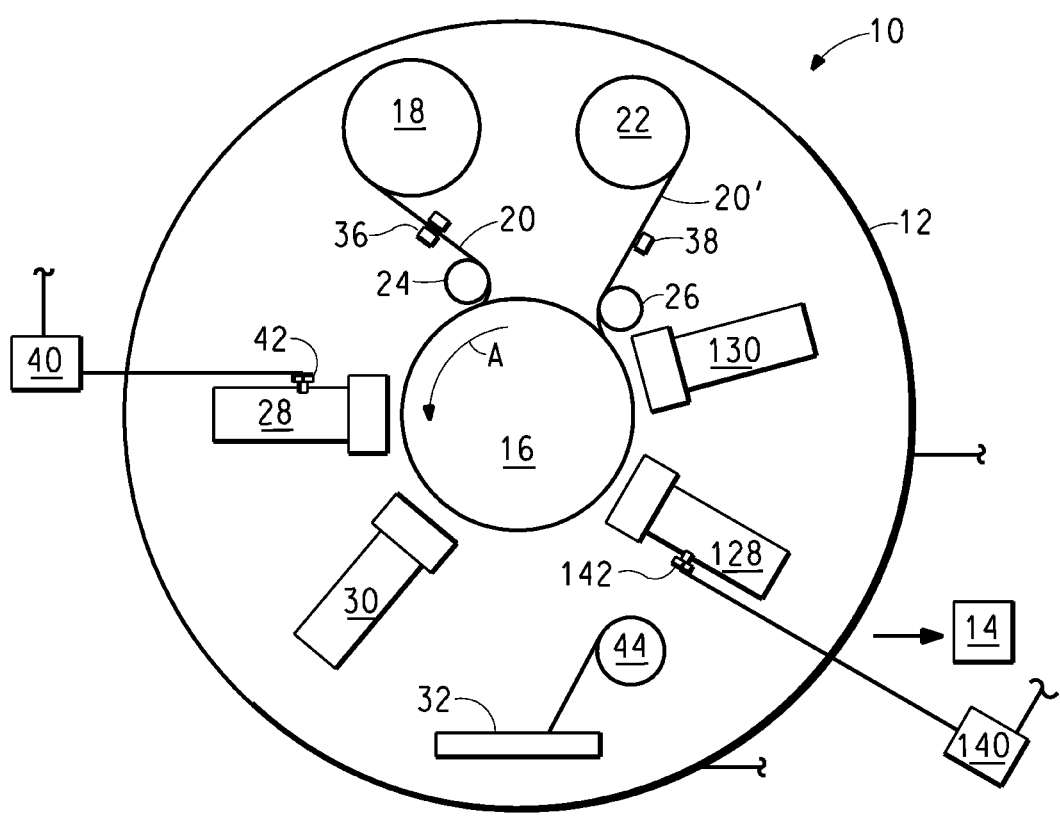
FIG. 1 is a schematic diagram of a prior-art apparatus for coating a substrate material.

The term "nonwoven sheet" as used herein refers to a structure of individual strands (e.g. fibers, filaments, or threads) that are positioned in a random manner to form a planar material without an identifiable pattern, as opposed to a knitted or woven fabric. Exemplary forms of nonwoven sheet include materials commonly termed nonwoven fabrics, nonwoven webs, and nonwoven layers. The term "fiber" is used herein to include staple fibers as well as continuous filaments. Examples of nonwoven sheets include meltblown webs, spunbond nonwoven webs, flash spun webs, staple-based webs including carded and air-laid webs, spunlaced webs, and composite sheets comprising more than one nonwoven web.

The term "woven sheet" is used herein to refer to sheet structures formed by weaving a pattern of intersecting warp and weft strands.

The term "fabric" is used herein to refer to both woven and nonwoven articles comprising a network of interlinked fibers, filaments, or threads forming a thin, generally planar and flexible structure.

The term "spunbond fibers" is used herein to refer to fibers that are melt-spun by extruding molten thermoplastic polymer material as fibers from a plurality of fine, usually circular, capillaries of a spinneret with the diameter of the extruded fibers then being rapidly reduced by drawing and then quenching the fibers.

The term "meltblown fibers" is used herein to refer to fibers that are melt-spun by meltblowing, which comprises extruding a melt-processable polymer through a plurality of capillaries as molten streams into a high velocity gas (e.g. air) stream.

The term "spunbond-meltblown-spunbond nonwoven sheet" ("SMS") is used herein to refer to a multi-layer composite sheet comprising a web of meltblown fibers sandwiched between and bonded to two spunbond layers. Additional spunbond and/or meltblown layers can be incorporated in the composite sheet, for example spunbond-meltblown-meltblown-spunbond webs ("SMMS"), etc.

The term "plexifilamentary" is used herein to characterize a three-dimensional integral network or web of a multitude of thin, ribbon-like, film-fibril elements of random length and with a mean film thickness of less than about 4 µm and a median fibril width of less than about 25 µm. In plexifilamentary structures, the film-fibril elements are generally coextensively aligned with the longitudinal axis of the structure and they intermittently unite and separate at irregular intervals in various places throughout the length, width, and thickness of the structure to form a continuous three-dimensional network. A nonwoven web of plexifilamentary film-fibril elements is referred to herein as a "flash spun plexifilamentary sheet".

As used herein, the term "tape" refers to a flattened strand, such as flattened strands formed from a slit film.

As used herein, the term "metal" includes metal alloys as well as individual metals.

The term "wall system" is used herein to refer a wall in a building construction. A wall system ordinarily includes internal lining and outer skin layers, and other wall elements intermediate the internal lining and outer skin layers. The intermediate elements can include supporting frame elements such as vertical wooden or metal studs, at least one air space, insulation material, one or more optional vapor barrier layers, and a moisture vapor permeable sheet such as the composite sheet provided herein.

The term "roof system" is used herein to refer to a roof in a building construction. A roof system ordinarily includes supporting roof frame elements such as pitched wooden rafters, external roofing material and other roof elements. Roof systems can be classified as warm roof systems and cold roof systems. In a cold roof system, the other roof elements can include at least one optional vapor barrier layer, at least one air space (which can be the attic air space), elements intermediate the supporting roof frame elements and the external roofing material such as battens or solid sheathing, a moisture vapor permeable sheet, such as the present composite sheet, and insulation material installed at the floor level of the attic space, above the interior ceiling level. In a warm roof system, the other roof elements can include, in addition to those listed for a cold roof system, an attic ceiling and insulation installed above the attic ceiling (instead of at the floor level of the attic space). The other roof elements can be intermediate the supporting roof frame elements and the external roofing material, or attached to the side of the supporting roof frame elements facing towards the attic space, or installed between adjacent roof frame elements, etc., depending on the specific roof element.

An aspect of the present invention provides a metalized composite sheet, in which a substrate is overlaid with a metal layer and an outer protective polymer coating layer. In an embodiment, the metallization and polymer layers are applied to a surface of a moisture-permeable substrate in a manner that substantially preserves the substrate's permeability. The substrate may be a sheet layer in which one or both sides comprise a porous outer surface, such as a fibrous surface or a porous film. In an embodiment, the polymeric and metal layers are formed using physical vapor-phase deposition techniques, such as evaporation. Typically the polymeric material is derived from a monomeric precursor that is first deposited as a vapor and subsequently polymerized and cured to form the final material. These techniques deposit precursor material on the exposed, outward-facing surfaces of the substrate, but in addition, some amount of the material ordinarily permeates within the surface structure and is deposited through the external surface and onto internal surfaces that define interstices or pores, e.g. as formed by an interlinking network of fibers.

In an embodiment, the deposition processes and material are controlled such that the pores and interstices are not significantly bridged, covered, or filled, so that the composite structure retains a desired level of moisture vapor permeability. For example, at least 80% of the permeability of the uncoated substrate may be preserved after the full coating is formed and fully processed. In some embodiments, at least 90%, or 95%, or 98% of the uncoated permeability is retained. The coating material delivered may also be controlled such that the surfaces of fibers in the interior structure of the substrate remain substantially uncoated. For some end-use applications, high moisture permeability may not be required, so that some implementations need not feature retention of a high permeability after coating and thicker coatings may thus be permitted.

In other implementations the polymer precursor is applied by any method that permits application of a sufficiently uniform coating having the requisite thickness. Without limitation, such methods may employ brushes, pads, rollers, spray or mist coating, dipping, or flow, roll, or curtain coating, or the like. Certain printing processes, including without limitation flexographic printing, may also be used. In some of these implementations, the vapor permeability of the substrate is substantially maintained after such deposition.

The present metalized sheet is beneficially employed in applications that include wall and roof systems. In embodiments useful in these situations, the sheet's moisture permeability permits the escape of water vapor that would otherwise be trapped in wall or roof cavities. Such water vapor can originate in numerous ways, including normal domestic activities such as bathing, showering, and cooking, or from building occupants as evaporated sweat or exhalation as the product of metabolism. Water vapor that condenses in building cavities, especially during cold seasons, can cause rotting or other damage to structural members. On the other hand, the permeability of the present sheet ordinarily is not high enough to permit significant air or water infiltration.

Front-surface metallization beneficially imparts insulation value to the basic sheet material. Incorporating a metalized material in wall or roof surfaces improves the energy efficiency of a building, e.g. by causing reflection of incoming solar radiation during warm summer and reducing the amount of heat radiated from the structure during cold winter. The effectiveness of the metallization layer for both these functions may be quantified by its emissivity, which is the ratio of the power per unit area radiated by a surface to that radiated by a perfect black body at the same temperature. A black body therefore has an emissivity of one and a perfect reflector has an emissivity of zero. The lower the emissivity, the better the thermal barrier properties pertinent for both seasons, i.e. improved reflection of incident radiation in summer and reduced emission of thermal radiation in winter. However, it has been found that the effectiveness of the metalization layer in existing products is subject to degradation, as reflected in an increased emissivity believed to be caused by corrosion of the metal surface.

As noted above, the '740 publication provides a process for manufacturing a plexifilamentary sheet on which organic and metal layers are coated under vacuum. This process can be implemented using the apparatus schematically shown at 10 in FIG. 1 of the present application, which is a reproduction of FIG. 1 of the '740 publication.

Apparatus 10 includes a vacuum chamber 12, which is connected to a vacuum pump 14, permitting evacuation of the chamber to a desired pressure. Moisture vapor permeable, plexifilamentary sheet 20 is supplied from unwind roll 18 onto a cooled rotating drum 16, which rotates in the direction shown by arrow "A", via guide roll 24. The sheet forms a substrate that passes through several deposition stations, after which it is picked off of the surface of the rotating drum by guide roller 26 and taken up by wind-up roll 22 as a coated composite sheet. Drum 16 may be cooled to a temperature said to be chosen to facilitate condensation of the particular precursor appointed to form the organic coating. Vacuum compatible monomers, oligomers, low molecular weight polymers, and combinations thereof are said by the '740 publication to be suitable for preparing organic coating layers. After unwinding from roll 18, the substrate passes through optional plasma treatment unit 36, where the surface of the sheet is exposed to a plasma discharge excited by low frequency RF, high frequency RF, DC, or AC.

According to the '740 disclosure, an intermediate organic layer may be formed on the substrate prior to depositing the metal layer, e.g. by deposition of organic precursor on the substrate from evaporator 28, which is supplied with liquid precursor from a reservoir 40 through an ultrasonic atomizer 42. It is said that with the aid of heaters, the liquid is instantly vaporized, i.e., flash vaporized, so as to minimize the opportunity for thermal polymerization or degradation prior to being deposited on the substrate.

The vaporized precursor condenses on the surface of the substrate sheet and forms a liquid film layer that is said to be solidified rapidly after condensation onto the sheet using a radiation curing means 30. Suitable radiation curing means are said to include electron beam and ultraviolet radiation sources that cure the monomer or other precursor film layer by causing polymerization or cross-linking of the condensed layer. If an electron beam gun is used, the energy of the electrons should be sufficient to polymerize the coating in its entire thickness. For oligomers or low molecular weight polymers that are solid at room temperature, it is said that curing may not be required. Monomers said by the '740 publication to be useful include acrylates disclosed by U.S. Pat. No. 6,083,628 and international patent publication WO98/18852.

After depositing the intermediate organic layer, the coated substrate in the '740 process then passes to metallization system 32, where the metal layer is deposited on the organic layer. When a resistive metal evaporation system is used, the metallization system is continually provided with a source of metal from wire feed 44.

Following the metallization step, an outer organic coating layer is deposited in a similar process as described above for the intermediate polymer layer using evaporator 128, precursor reservoir 140, ultrasonic atomizer 142, and radiation curing means 130.

The thickness of the coating is said to be controlled by the line speed and vapor flux of the flash evaporator. As the coating thickness increases, the energy of the electron beam must be adjusted in order for the electrons to penetrate through the coating and achieve effective polymerization.

However, the present inventors have found that practical application of the foregoing process provided by the '740 publication is limited by its ability to efficiently produce a composite coated sheet product that attains all the desired functional properties. Ideally, the product retains substantially all of its porosity after the coating process, with its metalized layer remaining highly reflective, and thus insulative, for an indefinite period. In addition, it is desired that little or none of the organic coating be left un-polymerized.

In particular, the sheet provided by the '740 publication exemplifies the difficulty of using beam radiation to effect curing of a polymeric layer deposited on a fibrous substrate, because of the problem of shadowing inherently resulting from the three-dimensional topography of such a substrate.

It is known that an inadequately protected surface layer of aluminum, a metal commonly used for metallization, may undergo a continuing reaction with ambient moisture to form oxides or hydroxides beyond the native oxide that may form virtually immediately. Such a reaction typically results in undesirably degraded reflectivity and increased emissivity. A thicker polymeric layer would better protect the aluminum, but would exacerbate both the problem of incomplete curing and the likelihood for reduced permeability of the coated sheet, as more of the pores in the open network would tend to become filled. Techniques that might mitigate the reduction in porosity have been found to be prone to degrading the uniformity of coating, so that the expected protective benefit for the metal layer would not be fully realized in practice. In some instances, it has been found that a conventional coating must be applied and cured in multiple layers to provide an ultimate thickness affording adequate protection for the metallization, while attaining even a minimally tolerable curing fraction.

Figure 2A:
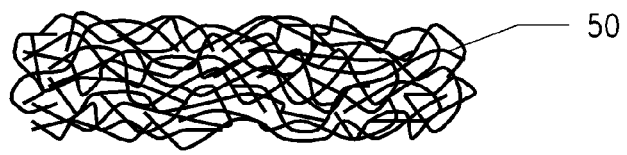
FIGS. 2A-2D are schematic, cross-sectional views of a prior art plexifilamentary substrate material at successive stages in which a multi-layer coating is being formed.
Figure 2A:
Figure 2B:
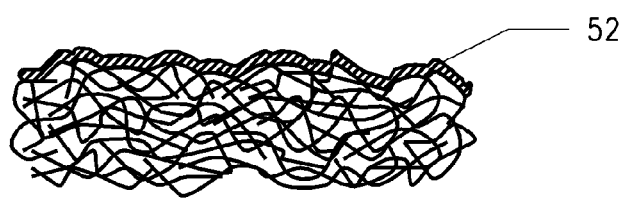
Figure 2B:

The difficulties encountered with a prior-art production method such as that of FIG. 1, may be visualized by reference to FIGS. 2A-2D, which schematically depict a product in various stages of its production using such a method. A plexifilamentary substrate, such as a conventional TYVEK® sheet 50 (FIG. 2A), is metalized in vacuum by overlaying a thin Al layer 52 provided by evaporation from a bulk Al source (FIG. 2B). Then a suitable precursor, such as an acrylate monomer, is evaporated and deposited onto the Al-metalized sheet as a coating 54, which may be about 0.5 to 1 µm thick.

Figure 2C:
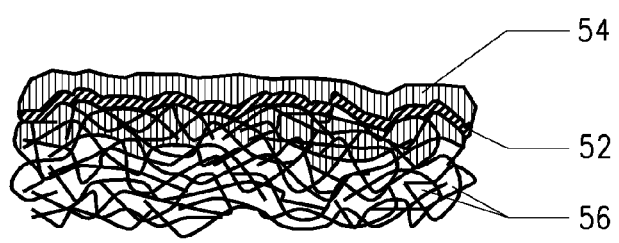
Figure 2C:

As schematically indicated in FIG. 2C, the open, three-dimensional porous structure characteristic of the plexifilamentary nature of TYVEK® sheet includes interstices 56, into which some of the deposited precursor inevitably infiltrates.

Figure 2D:
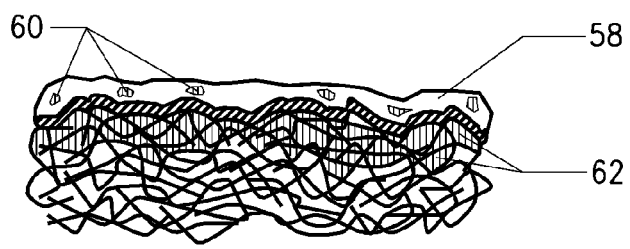
Figure 3C:
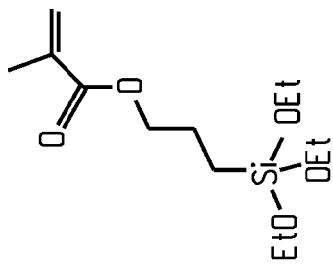
FIGS. 3A-3H depict representative polymer precursors useful in the present sheet and method.
Figure 3E:
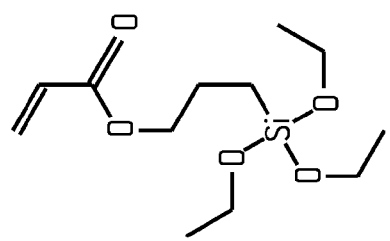
Figure 3B:
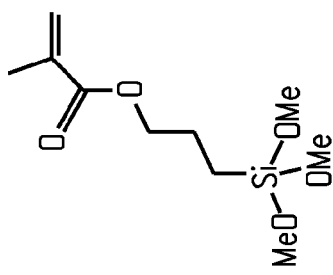
Figure 3D:
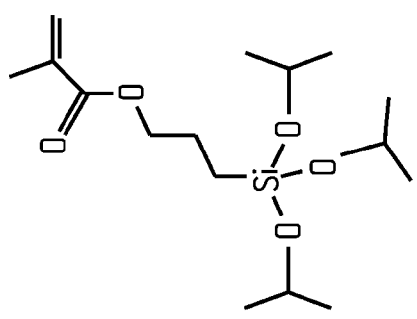
Figure 3A:
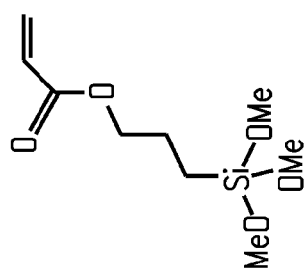
Figure 3F:
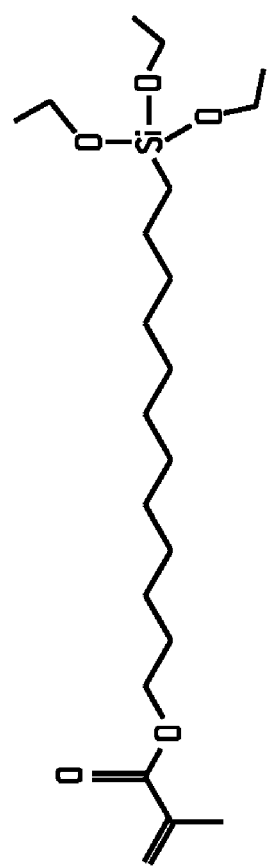
Figure 3G:
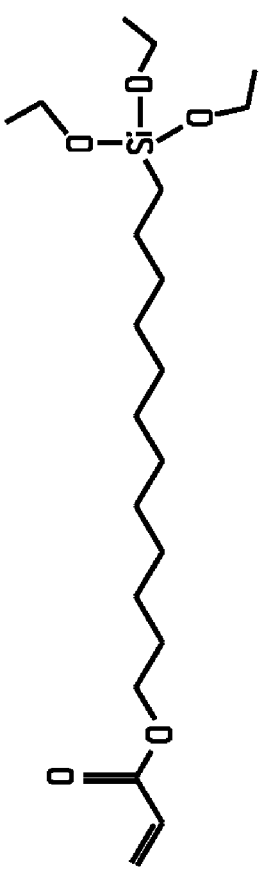
Figure 3H:
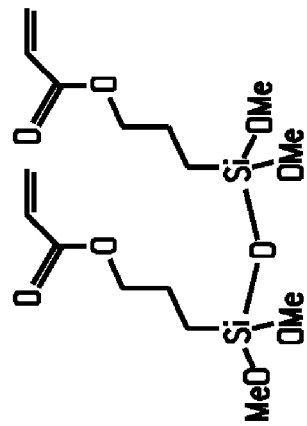

The deposited precursor is then cured to provide the required protective surface coating for the aluminized layer of the TYVEK® sheet. In some implementations, e-beam curing is used, meaning that the polymer precursor is exposed to the radiation of an e-beam that initiates monomer polymerization and polymer cross-linking of the coating to form the exterior protective polymeric coating (surface layer) 58 (FIG. 2D). By controlling the process parameters for both the Al and precursor depositions, the porosity of the bare TYVEK® sheet 50 generally can be maintained, meaning that the porosity of the sheet after the depositions is typically at least about 80% of the porosity of the starting sheet. By way of contrast, some previous coatings, such as a polyurethane coating deposited as a liquid by a flexographic printing process, have reduced permeability by 50% or more.

However, it has been found that the foregoing process typically results in an incomplete curing of acrylate monomers or other like precursors conventionally used in forming the protective polymeric coating 58. While the fraction of the coating 58 that is cured by present methods may be substantial, and may even comprise a preponderance of the deposited precursor, it is found in practice that some appreciable portion remains uncured. As apparent in FIG. 2D, the uncured portion may comprise both regions 60 within the surface 58, but, more importantly, regions 62 within interstices 56 that are geometrically shadowed from the incident e-beam. The presence of even modest amounts of unconverted acrylate monomer is undesirable.

The impediments of the foregoing process are addressed both by use of particular polymer precursor materials and improved curing processes provided in accordance with the present invention. As used herein, the term "precursor" is understood to refer to a substance suitable for preparing the polymeric coating layer of the present composite sheet material. Such substances include monomers, oligomers or low molecular weight (MW) polymers, and combinations thereof. The precursor may comprise one or more chemical components. In an embodiment, the precursor material is vacuum compatible but has high enough vapor pressure to evaporate rapidly in an evaporator without undergoing thermal degradation or polymerization, and at the same time does not have a vapor pressure so high as to overwhelm the vacuum system. The ease of evaporation depends on factors that include the molecular weight and the intermolecular forces between the monomers, oligomers or polymers, along with the ambient pressure in the coating chamber. It has been found that vacuum compatible monomers, oligomers and low MW polymers useful in this invention typically can have weight average molecular weights up to approximately 1200.

In an embodiment, the foregoing curing process is enhanced by combining an exposure of the deposited precursor to beam radiation with an exposure to a source of moisture. Such a dual-mode curing process is especially efficacious if the precursor layer comprises a polymerizable composition having functionality that renders it amenable to both free-radical and moisture-induced polymerization or cross-linking. In the present specification and subjoined claims, the term "dual-function composition" is understood to refer to a substance providing both these functionalities that may be incorporated as part or all of a precursor composition. It is presently believed that free-radical functionality allows beam radiation to cause curing by a free-radical mechanism, while the moisture-sensitive functionality facilitates curing alternatively driven by exposure to water vapor. The latter functionality of the precursor permits curing to occur even in shadowed regions of a fibrous or irregularly shaped substrate, that otherwise would be difficult or impossible to expose to beam radiation. Optionally, the precursor further includes a photoinitiator, which is particularly beneficial if UV radiation is to be used to induce curing. One such photoinitiator is 2-hydroxy-2-methyl-1-phenyl-1-propanone, which is sold commercially as DAROCUR 1173 by Ciba Specialty Chemicals Inc., Basel, Switzerland, but others known in the art may also be used.

The exposures to beam radiation and moisture can be accomplished either simultaneously or separately. In an embodiment, the beam radiation is sufficient to cause curing of a major fraction of the precursor, while a subsequent moisture exposure promotes curing of at least a substantial portion of the residual uncured precursor, especially the fraction located within parts of the fiber interstices shadowed from the beam radiation.

In various embodiments, the outer polymeric layer of the composite sheet comprises a three-dimensional network containing a plurality of linkages having a structure -A-R—B—, wherein A is an olefin group polymerically linked to another olefin group, B is a silane or isocyanate group cross-linked to another silane or isocyanate group, and R is a diradical comprising at least one of a C1 to C20 alkylene or aryl, each optionally substituted with a member selected from the group consisting of O, N, P and S, and wherein the alkylene can be linear, branched, or cyclic. The cross-linking of the silane or isocyanate groups to other silane or isocyanate groups ordinarily arises from reactions with water. Any technique providing an outer polymeric layer having the foregoing structure may be employed in manufacturing the present composite sheet.

In various embodiments, the precursor comprises a polymerizable composition that includes a radically polymerizable olefin group and at least one of a moisture curable isocyanate group or a moisture curable silane group. The respective olefin and isocyanate or silane groups provide the polymerizable composition with dual functionality allowing polymerization and curing by different mechanisms. The -A-R—B— structure discussed above may be formed, for example, by curing a precursor comprising a dual-function composition of this type. The dual-function composition is preferably a monomer, dimer, or trimer of such type. Of course, other groups providing moisture curability may replace the foregoing silane or isocyanate groups.

Representative examples of dual functional monomers with a radically polymerizable olefin group and a moisture curable isocyanate group include, but are not limited to, commercially available 2-isocyanoethyl (meth)acrylate, methacryloyl isocyanate, allyl isocyanate and also monomers obtained by reacting hydroxyl functional olefins, e.g., hydroxyethyl (meth)acrylate with multi-isocyanates, e.g., diisocyanates (hexamethylene diisocyanate, isophorone diisocyanate). The interaction of the isocyanate group with moisture is believed to cause a conversion of the isocyanate to an amine, which then cross links with another isocyanate to form a urea cross-linkage.

Representative examples of dual functional monomers with a radically polymerizable olefin group and a moisture curable silane group include, but are not limited to: (i) a (meth)acryloxyalkylsilane, (ii) a vinylsilane, allylsilane, or higher alkenylsilane, and (iii) a monomer obtained by reacting hydroxyl functional olefin with an isocyanoalkylsilane (e.g., hydroxyethyl (meth) acrylate with an isocyanopropyltrialkoxysilane), wherein each of the monomers comprises a moisture curable silane group which is one of a mono-, di- or tri-functional alkoxysilane, a phenoxysilane, an acyloxy(acetoxy)silane, an aminosilane, a halogenosilane, an amidosilane, an imidazolesilane, a carbamatesilane, a ketoximinesilane, or an oxazolidinonesilane. Specific useful examples include, but are not limited to, (meth)acryloxyalkyl-trialkoxysilanes, -dialkoxysilanes, and -monoalkoxysilanes, e.g., (meth)acryloxypropyltrimethoxysilanes, (meth)acryloxypropyltriethoxysilanes, (meth)acryloxypropyltripropoxysilanes, and (meth)acryloxypropyltributoxysilanes. A dimer, trimer, or higher oligomer of any of the foregoing silanes may also be employed.

Some of the foregoing materials are depicted structurally in FIG. 3, including acryloxypropyltrimethoxysilane (APTMS, FIG. 3A), methacryloxypropyltrimethoxysilane (MPTMS, FIG. 3B), methacryloxypropyltriethoxysilane (MPTES, FIG. 3C), methacryloxypropyltriisopropoxysilane (MPTiPS, FIG. 3D), acryloxypropyltriethoxysilane (FIG. 3E), methacryloxyundecyltriethoxysilane (FIG. 3F), acryloxyundecyltriethoxysilane (FIG. 3G), and low molecular weight oligomers of the foregoing, such as (1,1,3,3-tetramethoxydisiloxane-1,3-diyl)bis(propane-3,1-diyl) diacrylate (FIG. 3H) Other dimers, trimers and higher oligomers of the foregoing organosilanes are also useful. The interaction of moisture with the silane groups of the foregoing materials is believed to induce the formation of siloxane cross-linkages, as representatively depicted in FIG. 4.

Other monomers or lower oligomers having a radically polymerizable olefin and a moisture curable group providing the required dual functionality may also be employed in the present process and the coated sheet produced thereby. In an embodiment, substantially all of the polymerizable material in the precursor may be provided by such dual functionality materials. Alternatively, the precursor may include one or more additional polymerizable or curable components, including, but not limited to, acrylate, methacrylate, silane, and isocyanate compositions. In various embodiments, the coating may be prepared using a precursor comprising from about 0.1 to about 75 wt. % of a dual-function composition in combination with other polymerizable or curable components.

In some embodiments of the present disclosure, coated sheets manufactured using a dual functionality precursor afford various benefits. These benefits may include, without limitation, enhancement of any one or more of the following: adhesion, barrier properties, cross-linking density, and conversion fraction, depending inter alia on the substrate that is coated, the amount of dual functionality precursor included, and the manner in which curing is effected. For example, coatings prepared using precursors comprising as low as about 0.1 to 1 wt. % of a dual-function composition may show improved adhesion. Improvement in cross-linking density, which thereby improves barrier properties, typically requires somewhat more of the dual-function composition, e.g., at least about 5 wt. %, at least about 10 wt. %, or at least about 20 wt. % of the dual-function composition, while substantial improvement in conversion fraction is believed to require at least about 30 wt. %, at least about 50 wt. %, or at least about 75 wt. % of the dual-function composition.

Materials suitably admixed with the foregoing dual-function composition in the present precursor may include, without limitation, various comonomers such as acrylates or methacrylates that are radically curable. They may include, but are not limited to, polyol acrylates, acidic acrylates, amino acrylates and ether acrylates, as well as acrylates with other functionalites including hydroxyl, carboxylic, or sulfonic acid functionalities. Also useful in some embodiments are aliphatic, alicyclic, and aromatic oligomers or polymers or fluorinated acrylate oligomers or polymers. Suitable precursor constituents include materials disclosed by published patent applications US 2004/0241454 to Shaw et al., US2006/0078700 to Bletsos et al., and US 2006/0040091 to Bletsos et al., all of which are hereby incorporated in their entirety by reference thereto.

Embodiments, particularly those in which the precursor is applied using flash evaporation, may include an appreciable amount of diacrylate and/or triacrylate to promote crosslinking. Blends of suitable acrylates or methacrylates may be employed for obtaining desired evaporation and condensation characteristics and adhesion, and for control of shrinkage of the deposited film during polymerization. Ideally, molecules used in flash evaporation processes have sufficient thermal stability so they can be evaporated without decomposing and without polymerizing before they are deposited on the substrate, but thereafter can readily be cross-linked upon exposure to beam radiation. Triacrylates tend to be reactive and may polymerize at the evaporation temperatures. Increasing a precursor's average molecular weight generally necessitates a higher evaporation temperature but facilitates condensation on an unchilled substrate. In addition, it is generally found that the shrinkage upon curing is reduced by using materials with higher molecular weight per reactive group. Embodiments using a multi-component precursor are beneficially formulated such that the constituents have compatible evaporation and condensation characteristics to ensure that the precursor can be deposited and condensed without appreciable fractionation.

In an embodiment, the average molecular weight (MW) of monomers used in the precursor may be in the range of from 200 to 1200 for materials that are to be vacuum vapor deposited. It is found that using such a range balances the desirable characteristics of precursor evaporation at a reasonable temperature, precursor condensation on an unchilled substrate, and acceptably shrinkage that does not cause undue deformation of the substrate. However, the precursor used for the present composite sheet may include constituents having any molecular weight compatible with the deposition of a uniform coating of the desired composition. Because of their somewhat lower reactivity, some fluorinated monomers with higher molecular weights can also be used, as their volatilities are equivalent to those of lower molecular weight non-fluorinated acrylates.

Generally it is desirable for improving monomer conversion and cross-linking that at least a major portion of the acrylate monomer used in the present precursor is a polyfunctional acrylate. Preferably, the acrylate comprises at least 70 percent polyfunctional acrylates such as diacrylate or triacrylate.

In various embodiments, any of a wide variety of monoacrylates, diacrylates, triacrylates, and tetraacrylates may be included in the composition. In one embodiment, the precursor comprises hexane diol diacrylate (HDDA, MW of about 226) and/or tripropylene glycol diacrylate (TRPGDA, MW of about 300). Other acrylates may be used, sometimes in combination, such as: monoacrylates lauryl acrylate (MW 240) or epoxy acrylate RDX80095 made by Radcure of Atlanta, Ga.; diacrylates diethylene glycol diacrylate (MW 214), neopentyl glycol diacrylate (MW 212), propoxylated neopentyl glycol diacrylate (MW 328), polyethylene glycol diacrylate, tetraethylene glycol diacrylate (MW 302), and bisphenol A epoxy diacrylate; and triacrylates trimethylol propane triacrylate (MW 296), ethoxylated trimethylol propane triacrylate (MW 428), propoxylated trimethylol propane triacrylate (MW 470) and pentaerythritol triacrylate (MW 298). Monomethacrylates and dimethacrylates triethylene glycol dimethacrylate (MW 286) and 1,6-hexanediol dimethacrylate (MW 254) may also be useful, but may cure too slowly to be useful for some high speed coating operations.

It is found that film forming properties and adhesion between an acrylate coating and a substrate sheet may be enhanced by using a precursor that contains some amount of high molecular weight components. In practice very high molecular weight oligomers are usually mixed with low molecular weight monomers. The oligomers usually have molecular weights of greater than 1000, and often as large as 10,000 or even higher. Monomers are used as diluents to lower the coating viscosity and provide an increased number of linking groups for enhancing cure speed, hardness and solvent resistance in the resulting coating. It has generally been found infeasible to apply these high molecular weight substances directly by evaporation. However, by mixing high and low molecular weight constituents, satisfactory and efficient flash evaporation, condensation, and curing can be obtained.

When blends of high and low molecular weight acrylates are used, it is preferred that the weighted average molecular weight of the blend be in the range of from 200 to 1200. Such a precursor has been found to provide a desirable balance among the atomization and vaporization, condensation, and shrinkage characteristics.

In certain embodiments, the precursor is formulated to have a vapor pressure at 25° C. that ranges from about 0.1 to 100 Pa. Too low a vapor pressure requires an unacceptably high operating temperature to be able to evaporate sufficient material to form a coating on the sheet substrate at reasonable coating speeds. A high temperature may in turn lead to thermal decomposition or premature polymerization of the monomers. If the vapor pressure is too high, condensation and transfer efficiency of the monomer to form a film on the substrate may be too low for a practical and efficient coating operation, unless the surface of the substrate is cooled.

Small amounts of other substances may also be included in the precursor to facilitate deposition and processing. Without limitation, these substances include activators, sensitizers, photoinitiators, and the like. Dyes, pigments, fillers, UV stabilizers, and anti-oxidants are among other materials that also may be included.

The curing used in an embodiment of the present method entails exposure to both beam radiation and moisture, which may be accomplished either simultaneously or sequentially. The beam radiation may comprise charged particles or photons that emanate from suitable sources known in the art and are directed to impinge on the polymer precursor. In various possible embodiments, the beam radiation may be provided by energetic electrons or UV light photons.

Figure 4:
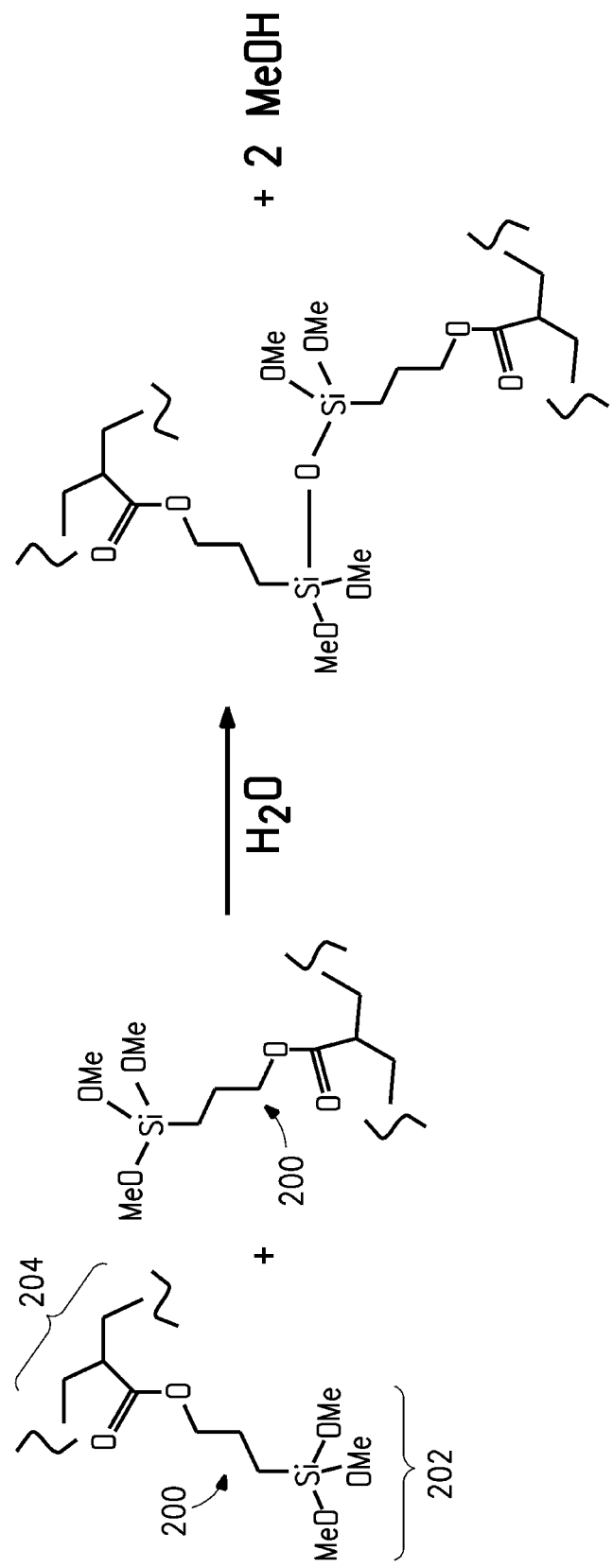
FIGS. 4 and 5 are schematic representations of reactions showing different aspects of the cross-linking of a dual-function monomer.
Figure 5:
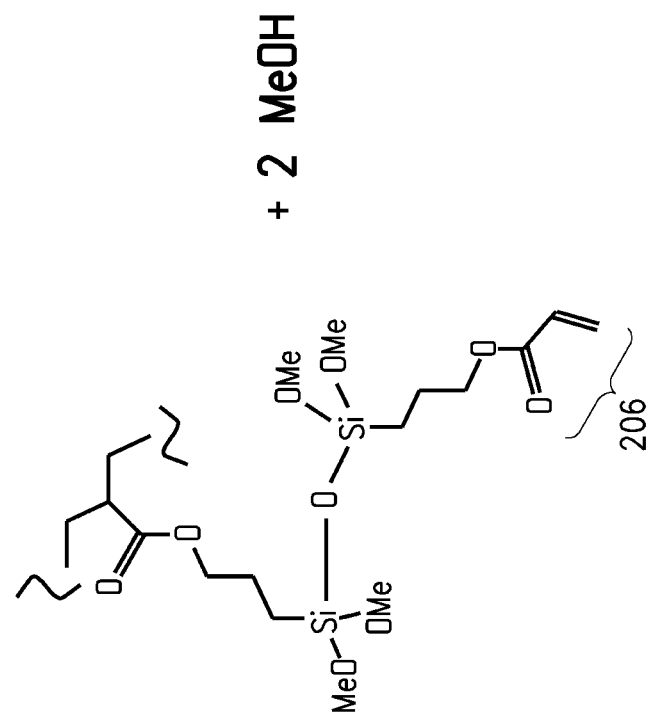
Figure 5:
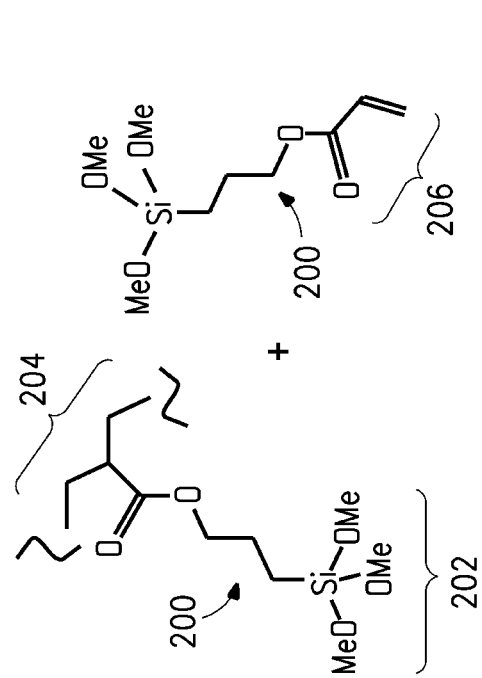

Possible reaction pathways for polymerization and cross-linking of acrylate silane monomers used in the present process are depicted schematically by FIGS. 4 and 5, which illustrate two aspects of the polymerization of exemplary acryloxypropyltrimethoxysilane monomers 200. FIG. 4 shows the cross-linking of the respective silane functional ends 202 of two monomer molecules that have been copolymerized at their acrylate functional ends with other acrylates, 204. The presence of a water molecule permits displacement of a methoxy group from each of the respective silicon atoms of the molecule, with the formation of a reactive silanol group followed by condensation with another methoxysilane or silanol group leading to a covalent bond linking the respective silicons through an intervening oxygen to form a siloxane linkage, with two methanol molecules as the reaction product. At the other ends 204, reaction of the acrylate double bond induced by irradiation permits linkage with other acrylate monomers via a free radical polymerization mechanism.

FIG. 5 shows a related aspect of the curing, in which the silane ends of the monomer molecules are cross-linked by the same mechanism, but with one of the unpolymerized monomers retaining an unreacted acrylate functional end 206 that is available for subsequent cross linking.

Figure 6:
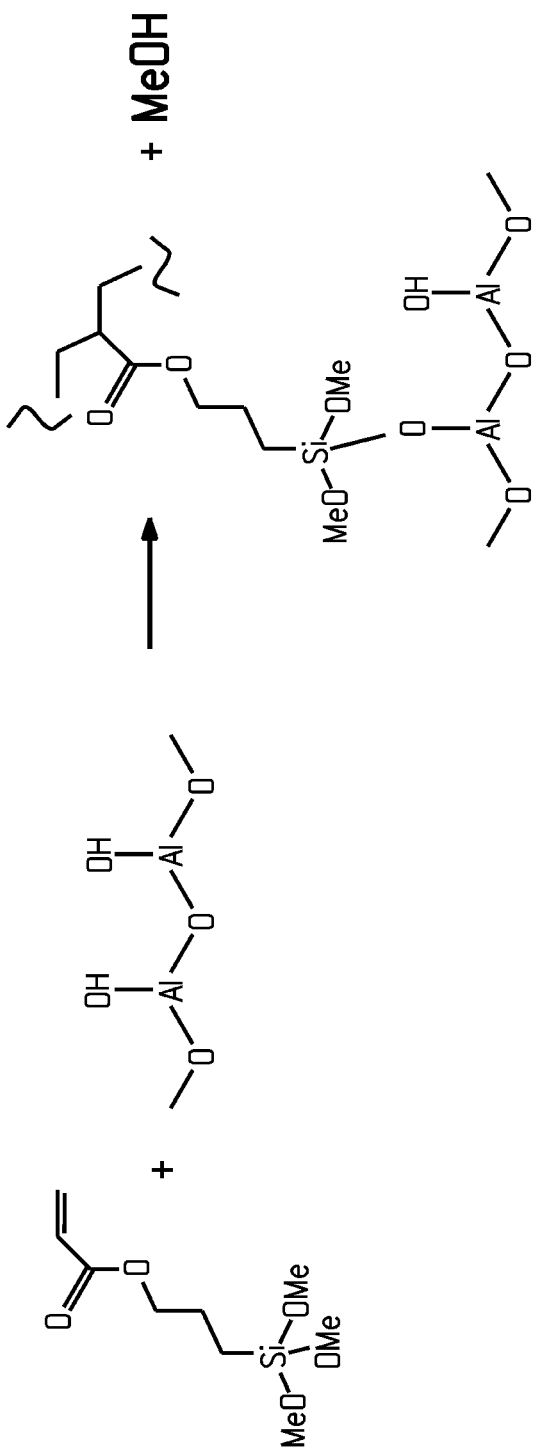
FIG. 6 is a schematic representation of a reaction showing covalent bonding of a monomer to a surface metal atom.

In some embodiments, the protection afforded by the coating material is believed to be enhanced further by physical and chemical interactions between the coating material and the surface metal. For example, it is believed that a covalent bond can be formed between a silane and a surface aluminum atom, as indicated schematically by the reaction in FIG. 6, wherein a surface hydroxyl group bound to an aluminum atom is removed and replaced by a covalent bond between the silane atom and the aluminum through an intervening oxygen atom which displaces a methoxy group, with formation of a free methanol molecule. Alternatively, the intermediate silanol group can react directly with aluminum or aluminum oxide. The silane-aluminum bonding is believed to be sufficiently tenacious to protect the aluminum surface by precluding subsequent oxidation. Free radical polymerization of the same silane monomer at the other end, which may be induced by beam radiation, is also indicated in FIG. 6.

In a further aspect of the invention, it has been found surprisingly that the thickness of the polymer coating required to protect the metallization layer can be reduced by incorporation of the present silane monomers. For example, a polymer layer formed from a precursor in which even a modest amount of silane monomer has been substituted for conventional acrylate or methacrylate monomers provides a comparable level of protection for the metallization, even at much lower thickness. This reduction is believed to arise from the efficacy of the aluminum-silicon bonding discussed above. Reducing the coating thickness has the concomitant effect of improving the monomer conversion and degree of curing induced by the initial beam radiation, which can more easily penetrate through the entire coating thickness. A lower coating thickness also improves production efficiency and reduces the amount of coating material that must be used and the amount of volatile organic material in the precursor carrier that is given off during the coating deposition.

For the sake of production efficiency, the present curing process may be carried out in an in-line, continuous process, in which the fibrous substrate material is supplied as a web of indeterminate length that successively advances through stations in which the sheet is first plasma-treated, and thereafter Al metallization and polymer precursor layers are successively deposited, with the sheet finally transiting through an e-beam zone. The application of the polymer precursor layer is optionally preceded by a plasma treatment of the metallization layer, e.g. to induce formation of a native, self-protective oxide film on the Al metallization. The sheet, with its coating partially cured by the e-beam, is subsequently exposed to water vapor. In some implementations one or more of the required steps can be accomplished in a separate batch operation. For example, the metalized sheet might be allowed to cool before being again plasma-treated and polymer coated.

In another embodiment, the coated sheet is located in a moisture-containing chamber and advanced as a web while simultaneously being illuminated with beam radiation, thereby providing both exposure modalities simultaneously.

In various other embodiments, the exposure to moisture occurs subsequent to the incidence of beam radiation, and may be done as part of a single continuous process or in a separate operation.

In yet another embodiment, the present sheet is manufactured in a continuous, in-line process that initially produces intermediate rolls bearing an extended, possibly indeterminate length of metalized sheet, with an as-yet incompletely cured polymeric coating. The rolls thereafter are stored, with moisture being provided simply from ambient water vapor that is picked up by the rolled sheet. After a sufficient storage time, some fraction of the precursor that was left uncured after exposure to beam radiation during the production of the intermediate rolls will be cured. Alternatively, the intermediate rolls might be stored after initial production in a chamber providing an elevated level of humidity to speed the kinetics of moisture-initiated curing. Optionally the humidity chamber might be maintained at a slightly elevated temperature that further speeds the curing kinetics but is not high enough to damage the substrate polymeric sheet or other constituents.

It is further found that curing of certain precursors amenable to beam-induced free-radical polymerization can also be driven by exposure to an ion source, such as the ions present in a suitable plasma discharge. Such a plasma can be created at either atmospheric pressure or in a partial vacuum by suitable choice of the ambient gases. It is believed that the plasma ions can generate free radicals that trigger cross-linking, but that other mechanisms may also contribute. Representative examples of apparatus used to generate such a plasma discharge include those provided by World Patent Application Publications WO2001/59809, WO2002/28548, and WO2005/110626, and US Published Patent Application US200510178330, all of which are incorporated herein in their entirety by reference thereto. Various embodiments of the present method employ plasma exposure as an alternative or supplement to beam radiation.

Thus, in still other embodiments, beam irradiation of the precursor is replaced by exposure to plasma discharge capable of inducing cross-linking. In some implementations, the plasma can be formed in a gas of suitable composition nominally at atmospheric pressure. Alternatively, some implementations are carried out in a plasma operating at sub-ambient pressure or in a vacuum; these necessitate a chamber. Embodiments that employ continuous feed implementations further require seals of any convenient type that permit material to pass in and out of the chamber without disrupting its atmosphere.

Figure 9:
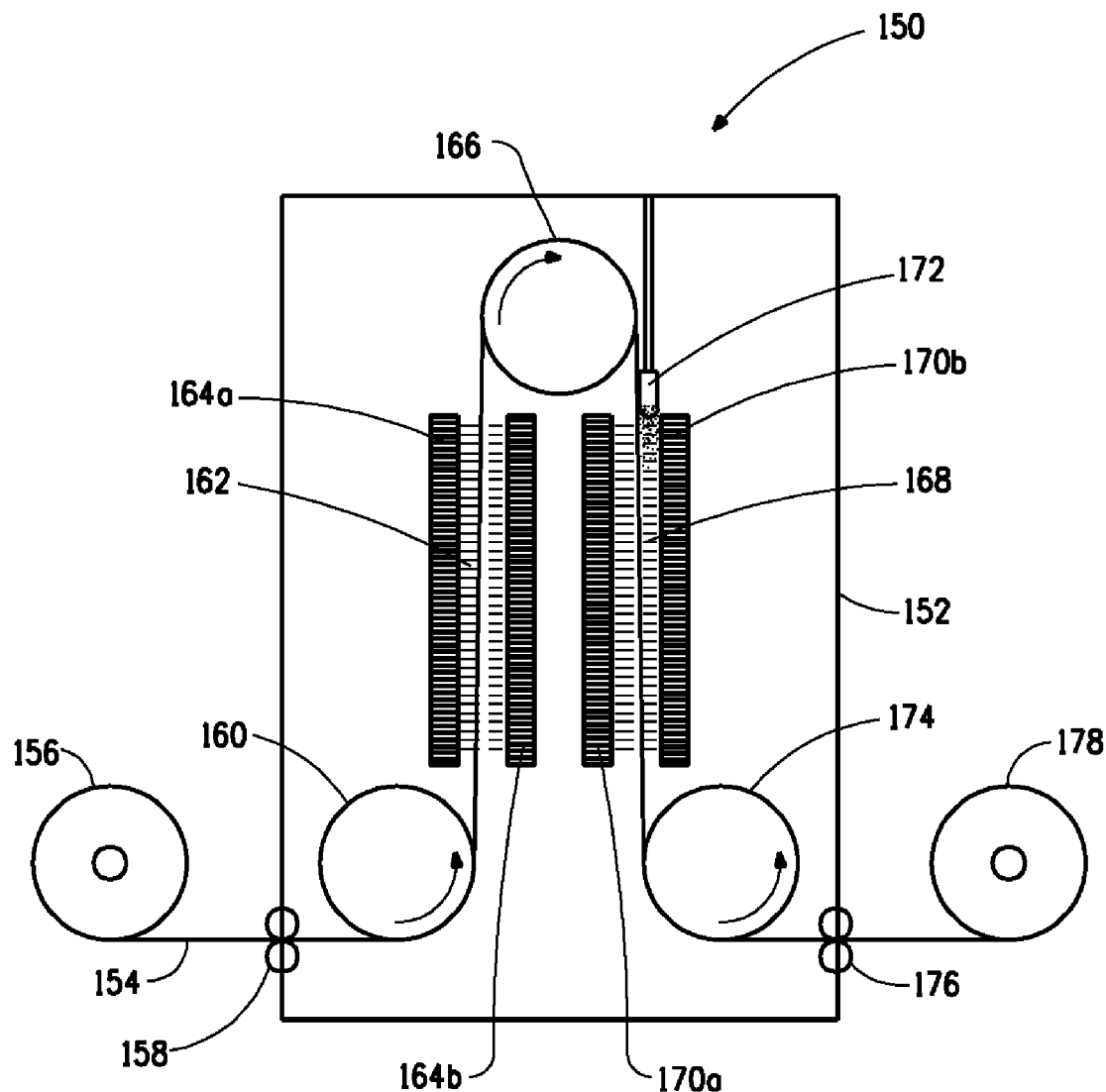
FIG. 9 is a schematic depiction of an apparatus used to deposit a coating on a moving web substrate in the presence of a plasma discharge.

An exemplary apparatus that may be used to deposit precursor and expose it to a plasma discharge that induces curing is depicted schematically by FIG. 9. As shown generally at 150, chamber 152 contains a suitable gas maintained at nominal atmospheric pressure. Web 154 is supplied from feed roll 156 and passes through entry nip roll seal 158 and across first guide roll 160 into first plasma zone 162. The entry and exit nip roll seals 158, 176 permit control of the chamber atmosphere while allowing passage of web 154. Electrodes 164a, 164b face the respective flat surfaces of web 154 and are energized to create a plasma discharge that cleans and prepares the web surfaces. Web 154 then is passed across second guide roll 166 into second plasma zone 168 defined by energized electrodes 170a, 170b. The precursor is injected through a nebulizer 172 to create small droplets, which are activated by ions in the plasma, thereby creating a mist of reactive droplets that deposit on the advancing web 154. Typically, polymerization occurs rapidly. Web 154 then passes across third guide roll 174 and through exit nip roll seal 176 for collection on takeup roll 178.

The techniques described herein are useful in the production of composite sheets that may have a variety of layer structures, including the single metalization and coating described above, as well as multiple metalizations and multiple coatings. In composite sheet structures having more than one metal layer, individual metal layers can be formed from the same or different metal and can have the same or different thickness. Similarly, in structures having more than one organic coating layer, the individual organic coating layers can have the same or different composition and/or thickness. Each metal layer can comprise more than one adjacent metal layers wherein the adjacent metal layers can be the same or different. Similarly, each organic layer can comprise more than one adjacent organic layer, wherein the adjacent organic layers can be the same or different. The substrate can be coated on one side, as in the structures described above, or on both sides.

In various embodiments of the present disclosure, the combination of exposure to beam radiation or plasma discharge and to water vapor is sufficient to effect curing of the precursor film to an extent such that the amount of extractable residual uncured precursor may be at most about 20%, or at most about 10%, or at most about 5% by weight of the total precursor deposited. In some embodiments, the present process provides substantially complete polymerization and cross-linking, by which is meant that the amount of extractable, unreacted precursor material is less than 5% by weight of the total precursor deposited.

The permeability of the present sheet structure may conveniently be characterized by its Gurley Hill porosity, which is an art-recognized measure of the barrier of sheet material for gases. In particular, the Gurley-Hill porosity is a measure of how long it takes for a given volume of gas to pass through an area of material wherein a certain pressure gradient exists. Gurley-Hill porosity may be measured in accordance with a protocol promulgated by TAPPI (formerly the Technical Association of the Pulp and Paper Industry) as Official Test Method T-460 om-06, which is incorporated herein by reference. This test measures the time required for 100 cubic centimeters of air to be pushed through a 2.54 cm diameter sample under a differential pressure of approximately 12.45 cm of water. The result is expressed in units of seconds, which are sometimes referred to as Gurley seconds. The Gurley Hill test may be carried out using apparatus such as a Lorentzen & Wettre Model 121 D Densometer.

Substrates suitable for forming the composite sheets of the present invention can have a relatively low air permeability, such as between about 5 and about 12,000 Gurley seconds, even between about 20 and about 12,000 Gurley seconds, even between about 100 and about 12,000 Gurley seconds, and even between about 400 and about 12,000 Gurley seconds, which is generally considered to provide a barrier to air infiltration. Alternately, the substrate can be selected to have a relatively high air permeability, for example those sheets having a Gurley Hill air permeability of less than 5 seconds, for which the air permeability may be characterized using the Frazier air permeability test, carried out in accordance with ASTM Standard D737, which is promulgated by ASTM International, West Conshohocken, Pa., and incorporated herein by reference.

In an embodiment, the present composite sheet may have a relatively high moisture vapor permeability, as characterized by a moisture vapor transmission rate measured in accordance with ASTM Standard F1249-06, which is incorporated herein by reference. In an embodiment, a composite sheet with a relatively high air permeability has a moisture vapor permeability of at least about 35 g/m²/24 hours, or even at least about 200 g/m²/24 hours, or even at least about 600 g/m²/24 hours.

It is to be noted that to make a valid and meaningful determination of the effect of the metal and polymer coating on the moisture permeability of the present composite sheet, the uncoated control sheet and the coated sheet being tested should be substantially equivalent. For example, substrate sheet samples from the same roll, lot, etc. used to make the coated sheet can be used to measure the moisture vapor permeability of the starting sheet. In one alternative, a section of the substrate can be masked prior to coating so that the masked section is not coated during the coating process, so that measurements can be made on samples taken from adjacent uncoated and coated portions of the sheet. In another alternative, uncoated samples can be taken from one portion of a roll of the substrate (e.g., its beginning and/or the end) and compared to coated samples made from another portion of the same roll.

The present composite sheet may also have a high hydrostatic head, meaning that the sheet resists penetration of a liquid such as $H_2O$ imposed on it in a static loading. A sheet used as building wrap may thus afford protection against intrusion of rain, snow, or other precipitation. Hydrostatic head is conveniently measured in accordance with standard ISO 811-1981, which is promulgated by the International Organization for Standards, Geneva, Switzerland, and is incorporated herein by reference. Tests of hydrostatic head can be carried out using a Shirley Hydrostatic Head Tester (Shirley Developments Limited, Stockport, England). In various embodiments, the sheet may have a hydrostatic head of at least about 20 cm $H_2O$, even at least about 50 cm $H_2O$, even at least about 100 cm $H_2O$, or even at least about 180 cm $H_2O$.

For use as a building wrap, the composite sheet preferably has a tensile strength of at least about 35 N/cm. Tensile strength can be measured in accordance with ASTM Standard D5035-06, which is incorporated herein by reference.

Substrates suitable for constructing the present composite sheet have a first outer surface and an opposing second outer surface. These substrates include, without limitation, sheets of various forms, such as both woven and nonwoven sheets. In an embodiment, the substrate comprises a woven fabric comprising woven fibers or tapes. In another embodiment, the substrate comprises a nonwoven sheet selected from the group consisting of flash-spun plexifilamentary sheets, spunbond nonwoven sheets, spunbond-meltblown nonwoven sheets, spunbond-meltblown-spunbond nonwoven sheets, and laminates that include a nonwoven or woven sheet or scrim layer bonded to a moisture vapor permeable film layer, such as a microporous film, a microperforated film or a moisture vapor permeable monolithic film. The starting substrate can also comprise a moisture vapor permeable sheet that has been coated using conventional coating methods.

Alternatively, the substrate comprises a multi-layer structure comprising at least one of a nonwoven sheet, a woven sheet, a nonwoven sheet-film laminate, a woven sheet-film laminate, or a composite thereof, with a porous sheet selected from the group consisting of microperforated films, woven sheets, and nonwoven sheets providing the first outer surface.

For example, sheets currently used in the construction industry include sheets of woven tapes that have been coated with a polymeric film layer and microperforated. The substrates may be formed from a variety of polymeric compositions. For example, sheets used in the construction industry are typically formed from polyolefins such as polypropylene or high density polyethylene, polyesters, or polyamides.

According to one embodiment of the invention, the substrate comprises a fibrous, nonwoven or woven sheet. Alternately, the substrate can be a sheet-film laminate wherein the sheet comprises an outer surface of the laminate, or the outer surface of the laminate can be a microperforated film. The metal and organic coating layers are deposited on the sheet or microperforated film such that, in the case of a fibrous sheet, the exposed surfaces of individual fibers or like strands on the coated surface of the composite sheet are substantially covered, while leaving the interstitial spaces or pores between the strands substantially uncovered by the coating material. By "substantially uncovered" is meant that at least 35% of the interstitial spaces between the fibers are free of coating. In one embodiment, the total combined thickness of the organic coating layers is less than the diameter of the fibers of the nonwoven web. For non-fibrous sheets, at least 35% of the surface pores on the sheet surface are substantially uncovered. This provides a coated composite sheet that has a moisture vapor permeability that is at least about 80%, even at least about 85%, and even at least about 90% of the moisture vapor permeability of the starting sheet material.

In an embodiment, the present sheet is fabricated using a moisture vapor-permeable, flash spun, plexifilamentary polyolefin sheet such as TYVEK® flash spun high density polyethylene, available from E.I. du Pont de Nemours and Company, Inc. (Wilmington, Del.), as a substrate sheet. Suitable flash spun plexifilamentary film-fibril materials may also be made from polypropylene or mixtures of polyolefins. The moisture vapor permeable sheet can be a laminate of a flash spun plexifilamentary sheet with one or more additional layers, such as a laminate comprising a flash spun plexifilamentary sheet and a melt-spun spunbond sheet. Flash spinning processes for forming web layers of plexifilamentary film-fibril strand material are disclosed in U.S. Pat. No. 3,081,519 (Blades et al.), U.S. Pat. No. 3,169,899 (Steuber), U.S. Pat. No. 3,227,784 (Blades et al.), and U.S. Pat. No. 3,851,023 (Brethauer et al.), the contents of which are hereby incorporated in their entirety by reference thereto.

The present improved coating and curing process is applicable to a wide variety of products, such as the moisture vapor permeable sheet substrates used in certain commercially available house wrap and roof lining products. Suitable flash-spun plexifilamentary sheets used in building construction include TYVEK® SUPRO roof lining, TYVEK® HomeWrap®, and TYVEK® CommercialWrap®. Other such materials include those sold by E.I. du Pont de Nemours and Company, Inc. (Wilmington, Del.) under trade names that include TYVEK®, Enercor Wall, Enercor Roof, Silver, and Reflex. Generally stated, TYVEK® materials are thin, flash-spun, plexifilamentary sheets comprised of an interlinked network of high density polyethylene fibers.

Other house wrap products suitable as the substrate include Air-Guard® Buildingwrap (manufactured by Fabrene, Inc., North Bay, Ontario), which is a woven fabric of high density polyethylene slit film that is coated with white pigmented polyethylene on one side and perforated; Pinkwrap® Housewrap (manufactured by Owens Corning, Toledo, Ohio), which is a woven fabric of polypropylene slit film that is coated on one side and perforated; Pinkwrap Plus® Housewrap (manufactured by Owens Corning, Toledo, Ohio), which is a cross-ply laminated polyolefin film that is micropunctured and has a corrugated surface; Tuff Wrap® Housewrap (manufactured by Cellotex Corporation, Tampa, Fla.), which is a woven fabric of high density polyethylene film that is coated on one side and perforated; Tuff Weather Wrap® (manufactured by Cellotex Corporation, Tampa, Fla.), which is a polyolefin sheet bonded to a nonwoven scrim that has been embossed to create small dimples on the surface; Greenguard Ultra Amowrap® (manufactured by Amoco, Smyrna, Ga.), which is a woven fabric of polypropylene slit film that is coated on one side and perforated; Weathermate® Plus Housewrap (manufactured by Dow Chemical Company, Midland, Mich.), which is a non-perforated, nonwoven membrane that has been coated with a clear coating; and Typar® Housewrap (manufactured by Reemay, Old Hickory, Tenn.), which is a coated spunbond polypropylene sheet.

The present fabrication and curing process is also applicable for embodiments that provide a metalized substrate that is substantially air impermeable, which is desirable for some end-use applications. For example, the substrate of these embodiments can comprise a laminate of a nonwoven or woven sheet bonded to a moisture vapor permeable film layer, wherein the moisture vapor permeable film layer is a microporous film or a monolithic film. For example, the sheet in some embodiments of such a laminate can be a fabric or scrim. Generally, one or more moisture vapor permeable film layers are sandwiched between outer nonwoven or woven sheet layers and the metal and polymeric coating layers are deposited on at least one of the outer layers such that a polymeric layer forms an outside surface of the composite sheet. In one such embodiment, a moisture vapor permeable film layer is sandwiched between two staple fiber nonwoven layers, or two continuous filament nonwoven layers, or two woven fabrics. The outer fabric or scrim layers can be the same or different.

Moisture vapor permeable, monolithic (nonporous) films useful in the practice of the present invention may be formed from a polymeric material that can be extruded as a thin, continuous, moisture vapor permeable, and substantially liquid impermeable film. The film layer can be extruded directly onto a first nonwoven or woven substrate layer using conventional extrusion coating methods. Preferably, the monolithic film is no greater than about 3 mil (76 µm) thick, even no greater than about 1 mil (25 µm) thick, even no greater than about 0.75 mil (19 µm) thick, and even no greater than about 0.60 mil (15.2 µm) thick. In an extrusion coating process, the extruded layer and substrate layer are generally passed through a nip formed between two rolls (heated or unheated), generally before complete solidification of the film layer, in order to improve the bonding between the layers. A second nonwoven or woven substrate layer can be introduced into the nip on the side of the film opposite the first substrate to form a moisture vapor permeable, substantially air impermeable laminate wherein the monolithic film is sandwiched between the two substrate layers.

Polymeric materials suitable for forming moisture vapor permeable monolithic films include block polyether copolymers such as a block polyether ester copolymers, polyetheramide copolymers, polyurethane copolymers, poly(etherimide)ester copolymers, polyvinyl alcohols, or a combination thereof. Preferred copolyetherester block copolymers are segmented elastomers having soft polyether segments and hard polyester segments, as disclosed in Hagman, U.S. Pat. No. 4,739,012 that is hereby incorporated by reference. Suitable copolyetherester block copolymers include Hytrel® copolyetherester block copolymers sold by E.I. du Pont de Nemours and Company (Wilmington, Del.), and Arnitel® polyetherester copolymers manufactured by DSM Engineering Plastics, (Heerlen, Netherlands). Suitable copolyetheramide polymers are copolyamides available under the name Pebax® from Atochem Inc. of Glen Rock, N.J., USA. Pebax® is a registered trademark of Elf Atochem, S.A. of Paris, France. Suitable polyurethanes are thermoplastic urethanes available under the name Estane® from The B.F. Goodrich Company of Cleveland, Ohio, USA. Suitable copoly (etherimide) esters are described in Hoeschele et al., U.S. Pat. No. 4,868,062. The monolithic film layer can be comprised of multiple layers moisture vapor permeable film layers. Such a film may be co-extruded with layers comprised of one or more of the above-described breathable thermoplastic film materials.

Microporous films are well known in the art, such as those formed from a mixture of a polyolefin (e.g. polyethylene) and fine particulate fillers, which is melt-extruded, cast or blown into a thin film and stretched, either mono- or bi-axially to form irregularly shaped micropores which extend continuously from the top to the bottom surface of the film. U.S. Pat. No. 5,955,175 discloses microporous films, which have nominal pore sizes of about 0.2 micrometer. Microporous films can be laminated between nonwoven or woven layers using methods known in the art such as thermal or adhesive lamination.

In an embodiment, microperforated films are formed by casting or blowing a polymer into a film, followed by mechanically perforating the film, as generally disclosed in European Patent Publication No. EP 1 400 348 A2, which indicates that the microperforations are typically on the order of 0.1 mm to 1.0 mm in diameter.

TYVEK® materials, as well as others listed above, are typically flexible, to permit their use in building and other applications, wherein they may be applied to curved or other non-planar surfaces and are often conformally affixed in large pieces around building corners and at corners associated with fenestrations and other like building openings. The present fabrication and curing process is applicable to flexible substrates, as well as to substantially rigid substrates and others exhibiting lesser flexibility. In an embodiment, flexible forms of the present coated sheet retain the surface metallization and outer polymeric coating without substantial degradation, even after flexure.

In other embodiments, the present composite sheet and coating process may employ a substrate comprising woven or nonwoven polyester, polyimide, polyamide, polysulfone, meta-aramid, or para-aramid fibers, or blends thereof, Alternatively, natural fibers, optionally blended with other of the foregoing fibers, may be used.

In various implementations, the deposition of both the metallization and polymeric coating layers of the present composite sheet may be carried out by any suitable physical vapor deposition technique. Such processes include those carried out in a vacuum, as known in the art. The thicknesses of the metal and polymeric material are preferably controlled within ranges that result in both the desired permeability and thermal properties of the composite.

In alternative implementations, including without limitation those appointed for producing sheets that need not exhibit high vapor permeability, other direct application methods may be used to deposit the polymer precursor, such as methods that employ brushes, pads, rollers, spray coating, dipping, or flow, roll, or curtain coating, or the like. Direct methods beneficially permit the precursor to include components having a wide range of volatility, including high MW components that could not be vaporized readily or low MW components would be difficult to condense on the substrate. Certain substances desirably incorporated in the precursor can be included, such as nonvolatile materials, activators, sensitizers, photoinitiators, UV stabilizers, anti-oxidants, dyes, fillers and pigments. In some embodiments, particularly those in which the precursor contains relatively low MW polymerizable components, sheets can be directly coated while still substantially maintaining a desired high vapor permeability.

In an embodiment, the thickness and the composition of the outer organic coating layer are selected such that the emissivity of the metalized substrate is not significantly increased, while the moisture vapor permeability of the substrate is also substantially unchanged. The outer polymeric coating layer may have a thickness between about 0.1 µm and 5 µm, which corresponds to between about 0.1 g/m$^2$ and 5 g/m$^2$ of the organic coating material, or a thickness between about 0.2 µm and 2.5 µm (about 0.2 g/m$^2$ to 2.5 g/m$^2$), between about 0.2 µm and 1.0 µm (about 0.2 g/m$^2$ to 1.0 g/m$^2$), or between about 0.2 µm and 0.6 µm (about 0.2 g/m$^2$ to 0.6 g/m$^2$). Sheets for which moisture vapor permeability is not required may employ thicker and more robust coatings, e.g. having a thickness between about 10 µm and 100 µm or between about 20 µm and 50 µm.

If the outer polymeric coating layer is too thin, it may not adequately protect the metal layer from degradation (e.g. from hydrolysis or oxidation), resulting in an increase in emissivity of the composite sheet. If the outer organic coating layer is too thick, it may contribute to some reduction of the emissivity of the coated surface and it may be difficult to fully cure the precursor layer, especially using e-beam radiation. In addition, some or all the pores may be bridged, thus reducing the moisture vapor permeability, which may be beneficial for some embodiments of the present composite sheet.

The durability of the composite sheet against degradation of the metalized layer resulting from moisture may conveniently be characterized by comparing the emissivity before and after a short-duration exposure to steam. In an implementation of this testing, a sheet of the present metalized material is placed to completely cover the open top of a water bath held at 90° C. so that the distance between the water surface and the test material is about 10 cm. After a preselected time period, the test material is removed and allowed to air dry. Tests of the optical density and emissivity are conducted before the exposure and after the sheet has dried. Such a test permits an accelerated determination of the behavior of the sheet under the conditions reasonably expected during its end use in building construction.

The term "optical density" is used herein in its conventional sense, being defined as the base-ten logarithm of the attenuation of light passing through the sheet, i.e. the ratio of the intensities of incident and transmitted light. Measurements may conveniently be conducted using an X-Rite 361T Optical Densitometer, in accordance with ANSI PH2.1986, which is promulgated by the American National Standards Institute, Washington, D.C., and incorporated herein by reference. The field of view of this densitometer is approximately a 5-mm diameter circle. Reported values typically are based on an average of multiple randomly selected areas of the test sheet.

Metals suitable for forming the metalization of the present composite sheets include aluminum, gold, silver, zinc, tin, lead, nickel, titanium, copper, and mixtures and alloys thereof. In an embodiment, the metal layer consists essentially of one of aluminum, gold, silver, zinc, tin, lead, nickel, titanium, copper, or a mixture or an alloy thereof. The metal layer can include other metals or elements, either as impurities or additions, so long as the metallization results in a low emissivity composite sheet. For example, the metal layer may include a thin surface oxide layer, either natively formed or induced. In various embodiments, the oxide layer may passivate the surface and/or improve the adhesion of the polymeric coating. Aluminum is beneficially employed, as it is easy to deposit by evaporation and readily forms a thin oxide passivation layer that affords some degree of surface protection. The metal layer can have any thickness consistent with the properties required for end use. In an embodiment, the metal layer has a thickness between about 15 nm and 200 nm, or between about 30 nm and 60 nm. The metal layer may consist essentially of aluminum having a thickness between about 15 and 150 nm, or between about 30 and 60 nm. If the metal layer is too thin, the layer will be at least partially transparent to visible and infrared wavelengths, so that desired properties, including thermal barrier properties, will not be achieved. If the metal layer is too thick, it can crack and flake off. Generally it is preferred to use the lowest metal thickness that will provide the desired thermal barrier properties. When the composite sheet of the present invention is used as a house wrap or roof lining, the metal layer reflects incident infrared radiation and emits little infrared radiation, providing a thermal barrier that reduces absorption of solar energy during the summer and energy loss by radiation in the winter, thereby reducing the requirements for air conditioning in the summer and heating in the winter, as needed to maintain a comfortable inside temperature year round. Methods for forming the metal layer are known in the art and include without limitation physical vapor deposition methods such as resistive evaporation, electron beam metal vapor deposition, laser ablation, and sputtering.

The thermal barrier properties of a material (i.e., its heat absorbance and reflectance characteristics) can be specified quantitatively by its emissivity, which is conveniently measured in accordance with ASTM Standard C1371-04a, which is incorporated herein by reference. Emissivity tests can be carried out using a Model AE D&S Emissometer (Devices and Services Co., Dallas, Tex.).

It is known that measured emissivity values can be influenced by multiple factors, notably including surface chemistry and roughness. Freshly polished aluminum typically has an emissivity between 0.039 and 0.057, whereas oxidized aluminum can exhibit between about 0.20 and 0.31. Typically, silver has an emissivity between 0.020 and 0.032, and gold between 0.018 and 0.035. In preferred embodiments, the macro-roughness of the present sheet is not significantly altered by the metallization and polymeric coating layers.

In some implementations of the present process, the metal layer and adjacent outer polymeric coating layer are deposited sequentially under vacuum, without free exposure to air or oxygen, to limit oxidation of the metal layer. Minimizing the degree of oxidation of the aluminum by depositing the outer polymeric coating layer prior to exposing the aluminum layer to the atmosphere significantly counters the tendency for the emissivity of the composite sheet to increase over time, compared to sheet having an unprotected layer of aluminum. Long-term protection of the metalized layer is enhanced by substantially complete curing of the outer organic coating layer. This layer also protects the metal from mechanical abrasion during roll handling, transportation and end-use installation.

The present process may be employed with a variety of fibrous substrates, including several conventional forms of TYVEK® sheet. In various embodiments, a fabric-like form of TYVEK® sheet metalized and coated using the present process may have an emissivity no greater about 0.2, or 0.15, or 0.12, or 0.10. In some embodiments, emissivity may be as low as 0.05. A paper-like form with greater microscopic surface roughness may have an emissivity of 0.2-0.25 after metallization and coating. By way of contrast, various conventional forms of TYVEK® sheets without metallization exhibit emissivities that may be as large as 0.5 or more.

The present composite sheets are useful in various building structural aspects, but especially in roof and wall systems. The highly reflective metalized surface of the present composite sheet provides a low emissivity surface that enhances the performance of the insulation and improves the energy efficiency of wall and roof systems, thus reducing energy costs for the building owner. Additional benefits include minimization of condensation inside wall and roof structures in cold climates and shielding of the building from excessive heat during the summer months. In one embodiment of the present invention, the moisture vapor permeable composite sheet is used in a wall or roof system and has an emissivity of no greater than about 0.15, a moisture vapor permeability of at least about 600 g/m²/24 hr, and a hydrostatic head of at least about 100 cm. The composite sheet is preferably installed in a wall or roof system such that the metalized side is adjacent to an air space. Alternately, the side opposite the metalized side can be adjacent an air space. The distance between the composite sheet and the second surface that forms the air space therebetween is preferably at least about 0.75 inch (1.9 cm). It is believed that installing the composite sheet adjacent an air space maximizes its effectiveness as a thermal barrier by allowing it to emit little radiant energy while reflecting most of the radiant energy it sees. If the metalized side is in intimate contact over large areas with solid components of the building construction, the energy may be transferred through the building components by conduction, and the effectiveness of the metalized sheet will be reduced. In pitched roof constructions, installing the composite sheet such that the metalized side faces generally downward and towards the attic space also minimizes the accumulation of dust, dirt, etc. that would tend to reduce its effectiveness as a thermal barrier.

Figure 7:
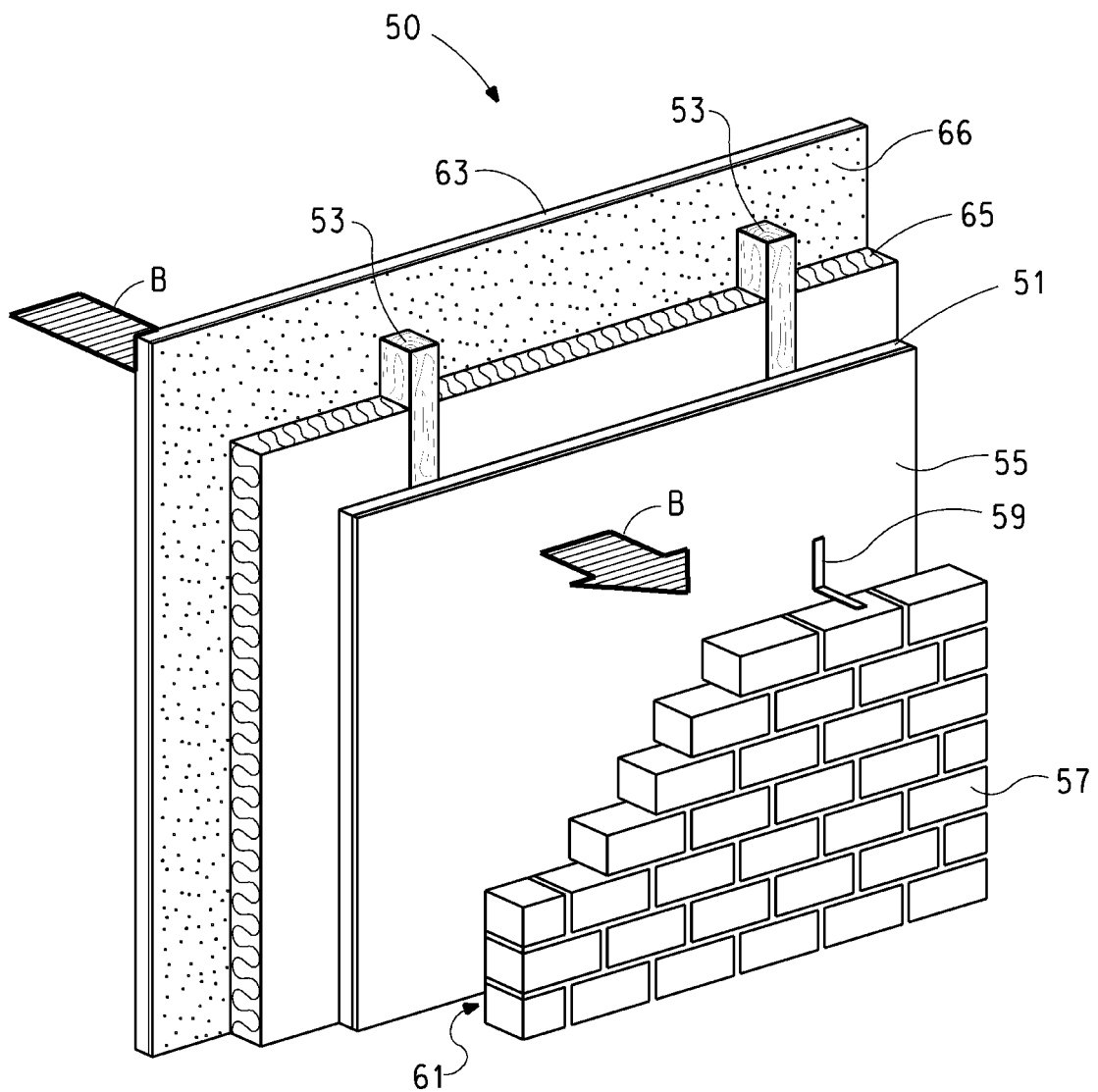
FIG. 7 is a schematic diagram in perspective view of a wall system in which a composite sheet of the present invention is used as a house wrap.

FIG. 7 is a schematic diagram of a wall system 50 in a frame construction building that utilizes the present composite sheet as a house wrap. Sheathing layer 51, such as plywood or the like, is attached to the outside of frame elements 53 that form the load-bearing frame of the building. Vertical frame elements 53 are typically formed of wood (e.g. wooden studs) but can be formed of metal in certain constructions. Breathable composite sheet 55 according to the present disclosure is attached to the outer surface of sheathing 51. In some building constructions, sheathing 51 is not used and the composite sheet 55 is attached directly to frame elements 53. Outer skin 57, which forms the exterior of the building (e.g. brick, concrete block, fiber-reinforced cement, stone, etc.) is separated from the composite sheet by metal straps 59 to form air space 61 therebetween. Wood strips or other spacing members can replace metal straps 59. The composite sheet is preferably installed such that the metalized surface of the composite sheet faces the air space. Alternatively, the composite sheet can be installed with the metalized side facing away from the air space. Internal lining 63 (e.g. gypsum wallboard) forms the interior wall of the building. Insulation 65 is installed in the wall between adjacent frame elements and between the internal lining and the sheathing layers (or between the internal lining and the composite sheet if a sheathing layer is not used). The wall structure optionally includes air leakage barrier and vapor barrier layer 66 intermediate the internal lining and insulation material. Layer 66 protects against convective heat loss and prevents excessive moisture generated in the house from penetrating into the insulation. The high moisture vapor permeability of the composite sheet allows water vapor to pass through the composite sheet in the direction of arrow "B" where it is dispersed in air space 61, thus preventing moisture condensation in the insulation. Composite sheets having low air permeability and high hydrostatic head also protect against wind and water penetration.

Figure 8A:
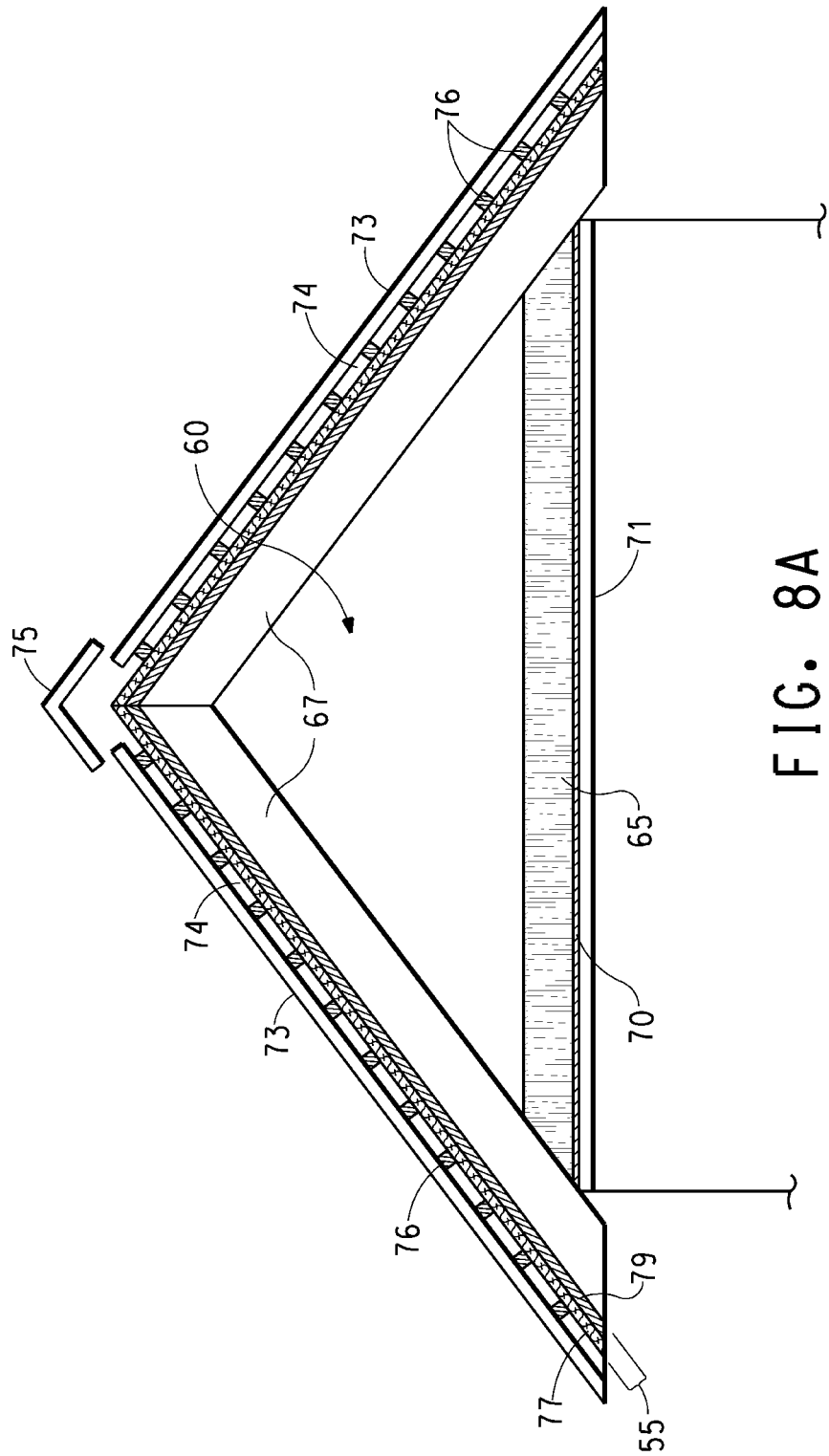
FIGS. 8A-8C are schematic diagrams in cross-sectional view of roof systems in frame construction buildings that include a composite sheet of the present invention and FIG. 8D is a schematic diagram in cross-sectional view depicting installation of a composite sheet on the floor joists of an attic of a building.

FIGS. 8A-8D are schematic diagrams of roof systems in frame construction buildings that include a composite sheet of the present disclosure. FIG. 8A illustrates an example of a "cold roof" system in which the interior attic space 60 is not intended to be habitable. The composite sheet 55 is installed above pitched roof frame elements (e.g. wooden rafters) 67. Insulation material 65 is installed between attic floor joists (not shown) above and adjacent to the level of interior ceiling 71. Optional vapor barrier 70 can be installed intermediate insulation 65 and interior ceiling 71. Spacing members (battens) 76 are placed adjacent the top surface of the composite sheet and external roofing material 73 (e.g. tiles, etc.) is installed on the spacing elements. There is a batten air space 74 above the composite sheet and between spacing elements (battens) 76 and the external roofing material. The ridge of the roof system is designated by 75. Composite sheet 55 is moisture vapor permeable and includes substrate 77 coated with metal and organic coating layers depicted as layer 79. Composite sheet 55 is installed such that the metalized side faces the attic space.

Figure 8B:
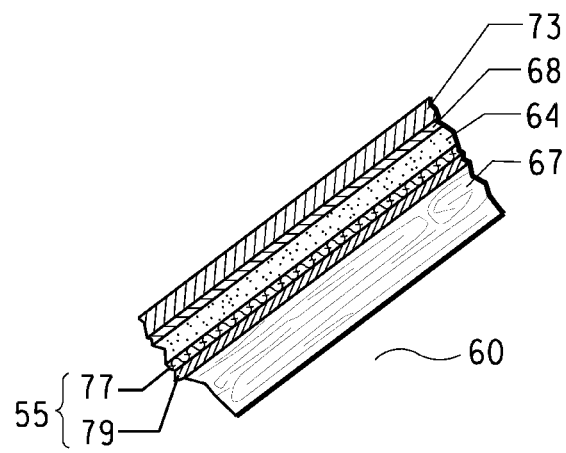
Figure 8C:
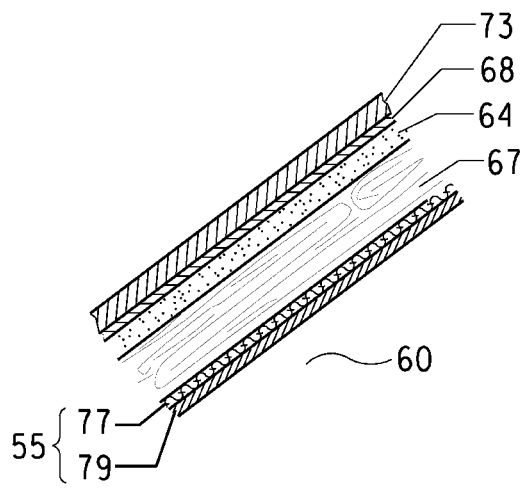

FIG. 8B is a cross-section through a portion of a cold roof system that includes a fully boarded deck instead of a batten system. Composite sheet 55 is installed on top of roof rafters 67, preferably with the metalized side 79 facing down towards the interior attic space 60. A solid roof deck 64 (e.g. plywood) is installed over the composite sheet and the external roofing is installed over the solid decking. Examples of external roofing include asphalt-coated felt or other roofing underlayment material 68 with exterior roofing material 73 such as tiles or asphalt shingles placed over the roofing underlayment. In another embodiment of a fully boarded deck shown in FIG. 8C, the metalized sheet 55 is attached to the underside of the roof rafters 67, with the metalized side 79 preferably facing down towards attic space 60. The composite sheet can be installed with the metalized side 79 facing away from the attic space; however dust and dirt accumulation on the metalized side can result in an increase in emissivity with time and a reduction in thermal barrier properties.

Figure 8D:
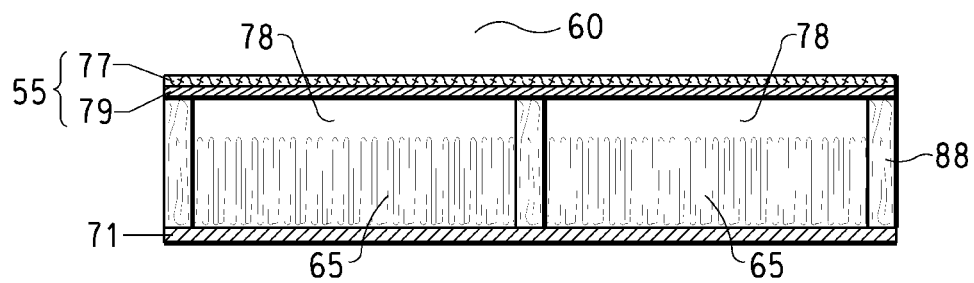

The composite sheet can also be installed on top of the attic floor joists 88 as shown in FIG. 8D. The composite sheet 55 is preferably installed with the metalized side 79 facing down, away from interior attic space 60 and towards insulation material 65, for the reasons stated above. An air space 78 is preferably provided between the insulation and the composite sheet.

The following examples are presented to provide a more complete understanding of the invention. The specific techniques, conditions, materials, proportions and reported data set forth to illustrate the principles and practice of the invention are exemplary and should not be construed as limiting the scope of the invention.

EXAMPLES

Example 1

The efficacy of moisture exposure as an activator for silane acrylate hydrolytic polycondensation was tested using 3-(trimethoxysilyl)-propyl acrylate.

Twelve samples of 3-(trimethoxysilyl)-propyl acrylate (about 25 mg each) (Gelest, Inc., Morrisville, Pa.) were charged into open 5-ml vials. Two of the vials were reserved as controls, while the remaining ten were placed inside a small jar which was then placed inside of a larger jar filled with water to a depth of about 1.25 cm. The larger jar was then sealed to create a room-temperature, water-saturated atmosphere inside. The larger jar was opened and two of the vials were removed after each of the following exposure times: 12 h, 24 h, 48 h, 96 h, and 100 h.

Each of the control and exposure vials was tested by quenching its contents with chloroform (1 g) for extraction. Thereafter, the contents were sonicated for 2 hours. The amount of unconverted monomer was measured by gas chromatography, permitting the fraction converted to be inferred from the known starting amount of monomer. The results are set forth in Table I below.

TABLE I

Conversion of Monomer Exposed to Moisture

| Exposure Time (h) | Fraction Converted |
|---|---|
| 0 | 0.00 |
| 12 | 0.10 |
| 24 | 0.10 |
| 48 | 0.11 |
| 96 | 0.46 |
| 100 | 0.62 |

Example 2

The experiment of Example 1 was repeated using samples prepared and tested using the same methods, but with longer exposure times up to 192 hours, yielding the results set forth in Table II below.

TABLE II

Conversion of Monomer Exposed to Moisture

| Exposure Time (h) | Fraction Converted |
|---|---|
| 0 | 0 |
| 48 | 0.38 |
| 72 | 0.32 |
| 168 | 0.75 |
| 192 | 0.81 |

The results of Examples 1 and 2 confirm that moisture alone can be used to promote hydrolytic polycondensation of acrylosilane monomers useful for coating fibrous substrates.

Example 3

The efficacy of polymeric coatings derived from various silane monomer precursors for protecting an aluminized plexifilamentary sheet was characterized.

A web of TYVEK® 15608 plexifilamentary sheet was prepared and metalized with an aluminum layer about 65 nm thick. Thereafter, a web of this material was processed using the apparatus depicted by FIG. 9 for application of a selected precursor material. The plasma was created in helium at nominal atmospheric pressure.

As set forth in Table III below, samples of coated sheet were prepared using several silanes (Gelest, Inc., Morrisville, Pa.) and with propoxylated neopentyl glycol diacrylate (SR9003, Sartomer Company, Inc., Exton, Pa.) as a non-silane control not known to be moisture polymerizable. Each precursor also included 0.1 wt. % of Uvitex, a fluorescent dye. Under illumination by UV light, the dye fluoresces a bright blue color, so each coated sheet could be examined to confirm that the precursor was uniformly deposited and present without obvious defects.

About 4 m of sheet were coated with each of the precursors, at a line speed of 5 m/min and a precursor feed rate of 900 μl/min. The He plasma power was set to 5 kW. The resulting coating basis weight was estimated to be approximately 0.25 g/m$^2$.

Webs were passed through the system one, two, or three times to obtain different coating thicknesses, as denominated by the basis weight.

Each sample was first examined under UV light to confirm that a uniform coating had been formed. Then a steam test was used to determine how well the aluminum layer was protected. For each test, a sheet was placed with its coated, metalized side across and facing the broad opening of a 90° C. water bath and held for 45 minutes. Afterward the sheet was allowed to air dry, then the optical density (OD) of the metallized sheet was measured in accordance with the protocol of ANSI PH2.1986 using an X-Rite 361T optical densitometer. The observed values are set forth in Table III, which also shows values for samples of two of the runs immediately prior to the steam exposure.

TABLE III

Optical Density of Polymeric Coated, Metallized Sheets after Steam Exposure

| Nominal Coating Wt. (g/m$^2$) | Coating Material | | | |
|---|---|---|---|---|
| | SR9003 | APTMS | MPTES | MPTiPS |
| (before exposure) | 2.16 | 2.09 | * | * |
| 0.25 | 1.11 | 2.11 | 2.14 | 1.74 |
| 0.50 | 1.82 | 2.11 | 2.24 | 2.26 |
| 0.75 | 2.19 | 2.23 | 2.15 | 2.15 |

* Not measured

Comparison of the optical densities measured after the steam exposure with values recorded for the sheets after metallization and polymeric coating but before the steam exposure shows the efficacy of thin layers of the various silane coatings in preventing degradation.

The emissivity of the same sheet samples was also measured after the steam exposure to yield the values set forth in Table IV, as well as comparative values prior to the exposure. Data were obtained using a Model AE D&S Emissometer.

TABLE IV

Emissivity of Polymeric Coated, Metallized Sheets after Steam Exposure

| Nominal Coating Wt. (g/m$^2$) | Coating Material | | | |
|---|---|---|---|---|
| | SR9003 | APTMS | MPTES | MPTiPS |
| (before exposure) | 0.165 | 0.153 | * | * |
| 0.25 | 0.339 | 0.098 | 0.126 | 0.158 |
| 0.50 | 0.170 | 0.108 | 0.112 | 0.113 |
| 0.75 | 0.126 | 0.106 | 0.118 | 0.115 |

The optical density and emissivity results in Tables III and IV demonstrate that silane coatings provide a level of protection of the metallization layer that is comparable to that obtained with a conventional acrylate (e.g. SR9003), even with a 25-50% thinner layer.

Example 4

The efficacy of polymeric coatings comprising a mixture of varying proportions of silane and non-silane monomer precursors for protecting an aluminized plexifilamentary sheet was characterized.

Precursor mixtures of 10, 30 and 50 wt. % APTMS with SR9003 and Uvitex OB at 0.1% were prepared and deposited on a web of Al-metallized TYVEK® 1560B plexifilamentary sheet as described in Example 3. The precursor feed rate was held at 900 μl/min with line speeds to 5, 10, and 15 m/min, to yield estimated coating thicknesses of about 0.250, 0.125, 0.072 g/m² for a single pass. Samples given the same steam exposure test (90° C./45 min) as in Example 3 were characterized by their optical density, measured as before using an X-Rite 361T optical densitometer, yielding the values set forth in Table V.

TABLE V

Mean Optical Density of Polymeric Coated, Metallized Sheets After Steam Testing

| Nominal Coating Wt. | Silane Concentration in Coating Material (wt. %) | | |
|---|---|---|---|
| (g/m²) | 10 | 30 | 50 |
| 0.072 | 1.07 | 1.05 | 1.69 |
| 0.125 | 1.06 | 1.32 | 1.82 |
| 0.250 | 1.17 | 1.77 | 2.16 |

These data show that the optical density of the metalized material before the steam test (2.2) was nearly fully maintained by the sample coated at only 0.25 g/m² and with 50% concentration of the APTMS (OD ~2.16), whereas a sample coated at the same 0.25 g/m² basis with the SR9003 acrylate showed marked degradation (OD ~1.11 per Example 3, Table III) after the same steam test.

Example 5

The efficacy of polymeric coatings comprising a mixture of silane (MPTiPS) and non-silane acrylate (SR9003) monomer precursors (50:50 by weight) for protecting an aluminized plexifilamentary sheet was again characterized. and compared with data for samples made with pure SR9003 and MPTiPS. Web samples were produced in a single pass using the same conditions as for Example 3, but with precursor feed rates of 500, 1000, 1500, and 2000 μl/min. At a line speed of 5 m/min, the resulting coating thicknesses were approximately 0.14, 0.28, 0.42, and 0.56 g/m².

The same steam test employed for the data of Examples 3 and 4 was run for a series of exposure times. For each precursor material and nominal coating weight, the exposure time to failure, defined as a reduction of the optical density below 80% of its pre-exposure value, was determined, yielding the values set forth in Table VI.

TABLE VI

Time to Failure (min) in Steam Testing of Polymeric Coated, Metallized Sheets

| Nominal Coating Wt. (g/m²) | Coating Material | | |
|---|---|---|---|
| | SR9003 | MPTiPS | 50/50 SR9003/ MPTiPS |
| 0.14 | 15 | >80 | >80 |
| 0.28 | 20 | >80 | >80 |
| 0.42 | 35 | >150 | >150 |
| 0.56 | 55 | >150 | >150 |

The results in Table VI demonstrate that even the thinnest coating (0.14 g/m²) tested, with a precursor containing 50% or 100% silane, provided durable protection, exceeding that provided by a conventional SR9003 acrylate coating four times thicker (0.56 g/m²).

Having thus described the invention in rather full detail, it will be understood that this detail need not be strictly adhered to but that further changes and modifications may suggest themselves to one skilled in the art, all falling within the scope of the invention as defined by the subjoined claims

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A process for manufacturing a composite sheet comprising:
    providing a substrate having a first outer surface and an opposing second outer surface;
    metalizing the first outer surface of the substrate to form thereon a metal layer;
    depositing on the metal layer a precursor of an outer polymeric coating layer to form a precursor film, the precursor comprising a dual-function composition including an olefin group and a moisture curable group; and
    treating the precursor to form the outer polymeric coating layer, the treating comprising:
        creating free radicals in the precursor to induce polymerization of at least a portion thereof; and
        exposing the precursor film to water vapor.

2. The process of claim 1, wherein the creating of free radicals comprises at least one of exposing the precursor film to a plasma discharge or irradiating the first outer surface with beam radiation provided by a radiation source.

3. The process of claim 1, wherein the creating of free radicals is accomplished by exposing the precursor film to a plasma discharge.

4. The process of claim 1, wherein the creating of free radicals is accomplished by irradiating the first outer surface with beam radiation provided by a radiation source.

5. The process of claim 4, wherein the beam radiation comprises electron beam radiation.

6. The process of claim 4, wherein the beam radiation comprises UV radiation.

7. The process of claim 1, wherein the creation of free radicals and the exposure to water vapor are sufficient to effect curing of the precursor such that the amount of uncured precursor extractable from the composite sheet is at most about 10% by weight of the outer polymeric coating layer.

8. The process of claim 1, wherein the creation of free radicals and the exposure to water vapor are sufficient to effect substantially full curing of the precursor film.

9. The process of claim 1, wherein the depositing comprises providing the precursor as a precursor vapor and condensing the precursor vapor onto the metal layer to form the precursor film.

10. The process of claim 1, wherein the precursor comprises an acrylate or methacrylate composition.

11. The process of claim 1, wherein the precursor comprises from about 0.1 to about 75 wt. % of the dual-function composition.

12. The process of claim 1, wherein the moisture curable group is a moisture curable isocyanate group.

13. The process of claim 1, wherein the moisture curable group is a moisture curable silane group.

14. The process of claim 1, wherein the metalizing is accomplished by a physical vapor deposition technique.

15. The process of claim 1, wherein the metal layer consists essentially of Al.

16. The process of claim 4, wherein the irradiation with beam radiation is carried out in a vacuum.

17. The process of claim 4, wherein the irradiation with beam radiation is carried out prior to the exposure to water vapor.

18. The process of claim 1, wherein the outer polymeric coating layer has a thickness ranging from about 0.1 to 5 µm.

19. The process of claim 1, wherein the substrate comprises a nonwoven sheet selected from the group consisting of flash-spun plexifilamentary sheets, spunbond nonwoven sheets, spunbond-meltblown nonwoven sheets, spunbond-meltblown-spunbond nonwoven sheets, and laminates that include a nonwoven sheet or scrim bonded to a moisture vapor permeable film layer.

20. The process of claim 1, wherein the substrate comprises a woven sheet comprising woven fibers or tapes.

21. The process of claim 1, wherein the substrate is moisture vapor permeable.

22. The process of claim 1, wherein the moisture vapor transmission rate of the composite sheet after the curing is at least about 80% of the moisture vapor transmission rate of the substrate without the metal and outer polymeric coating layers.

23. The process of claim 1, wherein the outer polymeric coating layer comprises no more than about 10% by weight of extractable, uncured precursor after the curing.

24. A process for manufacturing a composite sheet comprising:
    providing a substrate having a first outer surface and an opposing second outer surface;
    metalizing the first outer surface of the substrate to form thereon a metal layer;
    depositing on the metal layer a precursor of an outer polymeric coating layer to form a precursor film, the precursor being capable of being cured to form a three-dimensional network containing a plurality of linkages having a structure -A-R—B—, wherein A is an olefin group polymerically linked to another olefin group, B is a silane or isocyanate group cross-linked to another silane or isocyanate group, and R is a diradical comprising at least one of a C1 to C20 alkylene or aryl, each optionally substituted with a member selected from the group consisting of O, N, P and S, and wherein the alkylene can be linear, branched, or cyclic; and
    treating the precursor to form the outer polymeric coating layer, the treating comprising:
        creating free radicals in the precursor to induce polymerization of at least a portion thereof; and
        exposing the precursor film to water vapor.

* * * * *